(12) United States Patent
Blomberg et al.

(10) Patent No.: US 10,861,986 B2
(45) Date of Patent: Dec. 8, 2020

(54) PHOTOACTIVE DEVICES AND MATERIALS

(71) Applicant: ASM IP HOLDING B.V., Almere (NL)

(72) Inventors: Tom E. Blomberg, Vantaa (FI); Hannu Huotari, Helsinki (FI)

(73) Assignee: ASM IP Holding B.V., Almere (NL)

( * ) Notice: Subject to any disclaimer, the term of this patent is extended or adjusted under 35 U.S.C. 154(b) by 100 days.

(21) Appl. No.: 15/921,257

(22) Filed: Mar. 14, 2018

(65) Prior Publication Data

US 2018/0212077 A1 Jul. 26, 2018

Related U.S. Application Data

(62) Division of application No. 14/885,721, filed on Oct. 16, 2015, now Pat. No. 9,941,425.

(51) Int. Cl.
*H01L 31/18* (2006.01)
*H01L 31/0232* (2014.01)
(Continued)

(52) U.S. Cl.
CPC ........ *H01L 31/02322* (2013.01); *C23C 14/06* (2013.01); *C23C 14/0694* (2013.01); *C23C 16/22* (2013.01); *C23C 16/30* (2013.01); *C23C 16/45525* (2013.01); *H01L 31/032* (2013.01); *H01L 31/062* (2013.01);
(Continued)

(58) Field of Classification Search
CPC .......................... H01L 31/02322; H01L 31/18
See application file for complete search history.

(56) References Cited

U.S. PATENT DOCUMENTS 3,708,728 A    1/1973   Sterling et al.
3,925,337 A    12/1975   Heiberger
(Continued)

FOREIGN PATENT DOCUMENTS

CN    103920513 A    7/2014
EP    0387403    9/1990
(Continued)

OTHER PUBLICATIONS

Elers et al., "Atomic layer deposition of WxN /TiN and WNxCy/TiN nano laminates", Thin Solid Films 434 (2003) 94-99.*
(Continued)

*Primary Examiner* — Tae-Sik Kang
(74) *Attorney, Agent, or Firm* — Knobbe, Martens, Olson & Bear LLP

(57) ABSTRACT

Deposition processes are disclosed herein for depositing thin films comprising a dielectric transition metal compound phase and a conductive or semiconducting transition metal compound phase on a substrate in a reaction space. Deposition processes can include a plurality of super-cycles. Each super-cycle may include a dielectric transition metal compound sub-cycle and a reducing sub-cycle. The dielectric transition metal compound sub-cycle may include contacting the substrate with a dielectric transition metal compound. The reducing sub-cycle may include alternately and sequentially contacting the substrate with a reducing agent and a nitrogen reactant. The thin film may comprise a dielectric transition metal compound phase embedded in a conductive or semiconducting transition metal compound phase.

19 Claims, 19 Drawing Sheets

(51) Int. Cl.
*H01L 31/032* (2006.01)
*H01L 31/062* (2012.01)
*H01L 31/072* (2012.01)
*C23C 14/06* (2006.01)
*C23C 16/455* (2006.01)
*C23C 16/30* (2006.01)
*H01L 33/00* (2010.01)
*H01L 33/58* (2010.01)
*C23C 16/22* (2006.01)

(52) U.S. Cl.
CPC ............ *H01L 31/072* (2013.01); *H01L 31/18* (2013.01); *H01L 33/005* (2013.01); *H01L 33/58* (2013.01); *H01L 2933/0016* (2013.01); *H01L 2933/0025* (2013.01); *Y02E 10/50* (2013.01)

(56) References Cited

U.S. PATENT DOCUMENTS

| | | |
|---|---|---|
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,892,788 A | 1/1990 | Miller et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,482,570 A | 1/1996 | Saurer et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,793 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,197,683 B1 * | 3/2001 | Kang ............... C23C 16/34 204/192.17 |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,838,816 B2 | 1/2005 | Su et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,279,432 B2 | 10/2007 | Xi et al. |
| 7,405,158 B2 | 7/2008 | Lai et al. |
| 7,416,981 B2 | 8/2008 | Lee et al. |
| 7,794,798 B2 | 9/2010 | Hautala |
| 7,851,307 B2 | 12/2010 | Ramaswamy et al. |
| 7,867,557 B2 | 1/2011 | Pickett et al. |
| 8,054,669 B2 | 11/2011 | Meijer et al. |
| 9,412,602 B2 | 8/2016 | Blomberg et al. |
| 9,941,425 B2 | 4/2018 | Blomberg et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0054628 A1 | 3/2003 | Leng et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2003/0207593 A1 | 11/2003 | Derderian et al. |
| 2004/0130029 A1 | 7/2004 | Raaijmakers et al. |
| 2004/0185183 A1 | 9/2004 | Srinivasan et al. |

(56) References Cited

U.S. PATENT DOCUMENTS

| | | |
|---|---|---|
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0078679 A1 | 4/2006 | Elers et al. |
| 2006/0079090 A1 | 4/2006 | Elers et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0026671 A1 | 2/2007 | Kim et al. |
| 2007/0054046 A1 | 3/2007 | Ishizaka et al. |
| 2007/0148350 A1 | 6/2007 | Rahtu et al. |
| 2007/0218670 A1 | 9/2007 | Ishizaka |
| 2008/0102204 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0211526 A1 | 8/2009 | Tanaka et al. |
| 2009/0315093 A1 | 12/2009 | Li et al. |
| 2010/0039848 A1 | 2/2010 | Meijer et al. |
| 2010/0320365 A1* | 12/2010 | Trezza .............. H01L 27/14636 250/214 R |
| 2011/0020563 A1 | 1/2011 | Jiang et al. |
| 2011/0111298 A1 | 5/2011 | Lopez |
| 2012/0269962 A1 | 10/2012 | Blomberg et al. |
| 2013/0078454 A1 | 3/2013 | Thompson et al. |
| 2014/0273452 A1 | 9/2014 | Blomberg et al. |
| 2015/0004317 A1* | 1/2015 | Dussarrat ................ B05D 1/60 427/255.6 |
| 2015/0303101 A1 | 10/2015 | Blomberg et al. |
| 2017/0110601 A1 | 4/2017 | Blomberg et al. |

FOREIGN PATENT DOCUMENTS

| | | |
|---|---|---|
| EP | 0394054 | 10/1990 |
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1 158 070 | 11/2001 |
| EP | 1167567 | 1/2002 |
| JP | 58033841 | 2/1983 |
| JP | 6037041 | 2/1994 |
| JP | 6069157 | 3/1994 |
| JP | 7230957 | 8/1995 |
| JP | 8264530 | 10/1996 |
| JP | 09-087857 | 3/1997 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| WO | WO 96/17107 | 6/1996 |
| WO | WO 96/018756 | 6/1996 |
| WO | WO 98/051838 | 11/1998 |
| WO | WO 99/037655 | 7/1999 |
| WO | WO 00/001006 | 1/2000 |
| WO | WO 00/004704 | 1/2000 |
| WO | WO 00/040772 | 7/2000 |
| WO | WO 00/047404 | 8/2000 |
| WO | WO 00/047796 | 8/2000 |
| WO | WO 00/054320 | 9/2000 |
| WO | WO 00/55895 | 9/2000 |
| WO | WO 00/063957 | 10/2000 |
| WO | WO 01/027347 | 4/2001 |
| WO | WO 01/029280 | 4/2001 |
| WO | WO 01/029891 | 4/2001 |
| WO | WO 01/029893 | 4/2001 |
| WO | WO 01/053565 | 7/2001 |
| WO | WO 01/066832 | 9/2001 |
| WO | WO 01/078213 | 10/2001 |
| WO | WO 01/088972 | 11/2001 |
| WO | WO 2004/077515 | 9/2004 |
| WO | WO 2006/080782 | 8/2006 |
| WO | WO 2007/041089 | 4/2007 |
| WO | WO 2008/051851 | 5/2008 |
| WO | WO 2008/137399 | 11/2008 |

OTHER PUBLICATIONS

Hiral M. Ajmera, "Chemical Vapor Deposition of WNxCy Thin Films for Diffusion Barrier Application", A Dissertation Presented to the Graduate School of the University of Florida in Partial Fulfillment of the Requirements for the Degree of Doctor of Philosophy, University of Florida, 2007, pp. 1-299.*

Alen et al., "Atomic Layer Deposition of Ta(Al)N(C) Thin Films Using Trimethylaluminum as a Reducing Agent", Journal of the Electrochemical Society, 148 (10) G566-G571 (2001).*

Longrie et al., "Thermal and Plasma-Enhanced Atomic Layer Deposition of TiN Using TDMAT and NH3 on Particles Agitated in a Rotary Reactor", Appl. Mater. Interfaces 2014, 6, 7316-7324. (Year: 2014).*

1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: Anonymous[ANON], Sep. 19, 2005.

Aarik et al., "Influence of substrate temperature on atomic layer growth and properties of HfO2 thin films", Thin Solid Films, vol. 340, 1999, pp. 110-116.

Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.

Andricacos et al., Damascene copper electroplating for chip, IBM Jour. Research and Dev., 1998, vol. 42, Issue 5, pp. 567-574.

Bain et al., Deposition of tungsten by plasma enhanced chemical vapour deposition, J. Phys. IV France, 1999, vol. 9, pp. 827-833.

Blomberg et al., "TiF3:TiN nanocomposite thin films—a novel transparent conductor system", Physica Status Solidi C, 2017, vol. 14, No. 9 pp. 1700006-1-1700006-4.

Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).

Chookarjorn et al, "Design of Stable Nanocrystalline Alloys," Science Magazine, vol. 337, pp. 951-954, Aug. 24, 2012.

Elers et al., NbC15 as a precursor in atomic layer epitaxy, Applied Surface Science, Jul. 9, 1994, vol. 82/83, pp. 468-474.

Favis et al., Atomic layer epitaxy of silicon, silicon/germanium and silicon carbide via extraction/exchange processes, Avail. NTIS. Report, 1991, pp. 33.

Fuyuki et al., Atomic layer epitaxy controlled by surface superstructures in silicon carbide, Thin Solid Films, 1993, vol. 225, Issue 1-2, pp. 225-229.

Fuyuki et al., Atomic layer epitaxy of cubic silicon carbide by gas source MBE using surface superstructure, J. Cryst. Growth, 1989, vol. 95, Issue 1-4, pp. 461-463.

Girolami et al., Tailored Organometallics as Low-Temperature CVD Precursors to Thin Films, Materials Research Society Symposium Proceedings, 1988, vol. 121, pp. 429-438.

Gordon et al., "A Kinetic Model for Step Coverage by Atomic Layer Deposition in Narrow Holes or Trenches", Chemical Vapor Deposition, 2003, vol. 9, No. 2, pp. 73-78.

Hara et al., Atomic layer control of .beta.-silicon carbide (001) surface, Springer Proc. Phys., 1992, pp. 90-95.

(56) References Cited

OTHER PUBLICATIONS

Hiltunen et al., Nitrides of titanium, niobium, tantalum and molybdenum grown as thin films by the atomic layer epitaxy method, Thin Solid Films, 1988, vol. 166, pp. 149-154.

Houzouji et al., "Electroluminescence of TiO2 film and TiOx:Cu2+ film prepared by the sol-gel method", Chemical Physics Letters, vol. 254, pp. 109-113, 1996.

Hultman et al., "Review of the Thermal and Mechanical Stability of TiN-based Thin Films" Zeitscrift Fur Metallkunde 90 (10): 803-813 (1999).

Ihanus et al., "ALE growth of $ZnS_{1-x}Se_x$ thin films by substituting surface sulfur with elemental selenium," Appl. Surface Sci., 112:154-158 (1997).

International Search Report and Written Opinion dated Apr. 7, 2008, Application No. PCT/US2007/082131.

International Search Report and Written Opinion dated Jun. 25, 2015 in Application No. PCT/US2015/023492.

International Search Report and Written Opinion for International Application No. PCT/US2016/055496, Notification dated Dec. 23, 2016.

Jehn et al., Gmelin Handbook of Inorganic and Organometallic Chemistry, 8th Edition, 1993, vol. A 5b, Issue 54, pp. 131-154.

Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.

Juppo et al., Deposition of copper films by an alternate supply of CuCl and Zn, J. Vac. Sci. Technol A, Jul./Aug. 1997, vol. 15, Issue 4, pp. 2330-2333.

Kattelus et al., "Electrical Properties of Tantalum Based Composite Oxide Films," Mat. Res. Soc. Symp. Proc. vol. 284, pp. 511-516 (1993).

Kattelus et al., "Layered tantalum-aluminum oxide films deposited by atomic layer epitaxy," Thin Solid Films, Vo. 225, pp. 296-298 (1993).

Kim et al., Atomic-layer-deposited WNxCy thin films as diffusion barrier for copper metallization, Applied Physics Letters, Jun. 23, 2003, vol. 82, Issue 25, pp. 4486-4488.

Kim et al., "Novel capacitor technology for high density stand-alone and embedded DRAMs," IEEE International Electron Devices Meeting, IEDM (2000).

Kirk-Othmer, Encyclopedia of Chemical Technology, John Wiley & Sons, Inc., 1992, vol. 4, pp. 841-878.

Klaus et al., Atomic Layer Deposition of Tungsten Nitride Films Using Sequential Surface Reactions, Journal of the Electrochemical Society, 2000, vol. 147, Issue 3, pp. 1175-1181.

Klaus et al., Atomic layer deposition of tungsten using sequential surface chemistry with a sacrificial stripping reaction, Thin Solid Films, 2000, vol. 360, pp. 145-153.

Klaus et al., Atomic layer deposition of tungsten and tungsten nitride using sequential surface reactions, AVS 46$^{th}$ International Symposium, 1999, Seattle, WA, US.

Klaus et al., Atomically controlled growth of tungsten and tungsten nitride using sequential surface reactions, Applied Surface Science, 2000, vol. 162-163, pp. 479-491.

Kukli et al., Properties of $(Nb_{1-x}Ta_x)_2O_5$ Solid Solutions and $(Nb_{1-x}Ta_x)_2O_5$—$ZrO_2$ Nanolaminates Growth by Atomic Layer Epitaxy, , NanoStructured Materials, 1997, vol. 8, pp. 785-793.

Lai et al., Precursors for Organometallic Chemical Vapor Deposition of Tungsten Carbide Films, Chem. Mater., 1995, vol. 7, pp. 2284-2292.

Lakomaa et al., "Surface reactions in $Al_2O_3$ growth from trimethylaluminum and water by atomic layer epitaxy," Applied Surface Science, vol. 107, pp. 107-115 (1996).

Leskelä et al., ALD precursor chemistry: Evolution and future challenges, Jour. Phys. IV France 9, 1999, pp. 837-852.

Ludviksson et al., Low-Temperature Thermal CVD of Ti—Al Metal Films Using a Strong Reducing Agent, Chem. Vap. Deposition, 1998, vol. 4, Issue 4, pp. 129-132.

Martensson, Use of atomic layer epitaxy for fabrication of Si/TiN/Cu structures, J. Vac. Sci. Technol. B, Sep./Oct. 1999, vol. 17, Issue 5, pp. 2122-2128.

Martensson et al., Atomic Layer Epitaxy of Copper and Tantalum, Chemical Vapor Deposition, 1997, vol. 3, Issue 1, pp. 45-50.

Martensson et al., $Cu(THD)_2$ as Copper Source in Atomic Layer Epitaxy, Electrochemical Society Proceedings, vol. 97-25, (1997) pp. 1529-1536.

Matsunami et al., Hetero-interface control and atomic layer epitaxy of SiC, Applied Surface Science, 1997, vol. 112, pp. 171-175.

Meng et al., "$Ti^3$: $TiO_2/TiF_3$ hybrid with enhanced visible-light photocatalytic reactivity", The Royal Society of Chemistry 2014, 6 pages.

Min et al., Atomic Layer Deposition of TiN Films by Alternate Supply of Tetrakis (ethylmethylamino)-Titanium and Ammonia, Jpn. J. Appl. Phys., 1998, vol. 37, pp. 4999-5004.

Min et al., Atomic Layer Deposition of TiN Thin Films by Sequential Introduction of Ti Precursor and $HN_3$, Mat. Res. Soc. Symp. Proc., 1998, vol. 514, pp. 337-342.

Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.

Perebeinos et al., Investigation of the Jahn-Teller Transition in $TiF_3$ using Density Functional Theory, Department of Physics, Brookhaven National Laboratory, pp. 1-7, Jul. 26, 2013.

Pilvi, Atomic Layer Deposition for optical applications: metal fluoride thin films and novel devices, Academic Dissertation, University of Helsinki, 2008.

Polyakov et al., Growth of GaBN Ternary Solutions by Organometallic Vapor Phase Epitaxy, Journal of Electronic Materials, 1997, vol. 26, Issue 3, pp. 237-242.

Ritala et al., Atomic layer epitaxy growth of TiN thin films, J. Electrochem. Soc., 1995, vol. 142, Issue 8, pp. 2731-2737.

Ritala et al., Atomic Layer Epitaxy Growth of TiN Thin Films from $TiI_4$ and $NH_3$, J. Electrochem. Soc., Aug. 1998, vol. 145, Issue 8, pp. 2914-2920.

Ritala et al., "Controlled Growth of TaN, Ta3N5, and TaOxNy Thin Films by Atomic Layer Deposition", Chem. Mater., 1999, vol. 11, pp. 1712-1718.

Ritala et al., Effects of intermediate zinc pulses on properties of TiN and NbN films deposited by atomic layer epitaxy, Appl. Surf. Sci., 1997, vol. 120, pp. 199-212.

Ritala et al., Perfectly conformal TiN and Al2O3 films deposited by atomic layer deposition, Chem. Vapor Deposition, 1999, vol. 5, pp. 7-9.

Ritala et al., Surface roughness reduction in atomic layer epitaxy grown of titanium dioxide thin films, Thin Solid Films, vol. 249, pp. 155-162 (1994).

Sadayuki et al., Sub-atomic layer growth of SiC at low temperatures, Japanese Journal of Applied Physics, 1995, vol. 34, Issue 11, pp. 6166-6170.

Sherman et al., Plasma enhanced atomic layer deposition of Ta for diffusion barrier applications, AVS 46$^{th}$ International Symposium, Oct. 26, 1999, Seattle, WA, US.

Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.

Suntola, "Atomic Layer Epitaxy," Handbook of Crystal Growth 3, Ch. 14, pp. 601-663 (1994).

Titanium Nitride Properties, http://www.enigmatic-consulting.com/semiconductor_processing/CVD_Fundamentals/films/TiN.html, accessed online Oct. 30, 2015.

Triyoso, D.H. et al., "Characteristics of Mixed Oxides and Nanolaminates of Atomic Layer Deposited $HfO_2$—$TiO_2$ Gate Dielectrics," Journal of the Electrochemical Society, 153 (9), pp. 834-839, 2006.

Tulhoff et al., Ullmann's Encyclopedia of Industrial Chemistry, 5$^{th}$, Completely Revised Edition, 1986, vol. A5, pp. 61-77.

(56) References Cited

OTHER PUBLICATIONS

U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.
U.S. Appl. No. 10/242,368, filed Sep. 12, 2002 including prosecution history, including but not limited to, Office Action dated Oct. 20, 2004, Office Action dated Apr. 27, 2004, and Notice of Allowance dated Jul. 19, 2005.
U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.
U.S. Appl. No. 11/286,203, filed Nov. 22, 2005 including prosecution history, including but not limited to Office Action dated Sep. 28, 2007.
U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Web Elements, https://www.webelements.com/compounds/titanium/titanium_trifluoride.html, accessed online Oct. 30, 2016.
Wong et al., Barriers for copper interconnections, Solid State Technology, 1999, pp. 1-7.
Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).

* cited by examiner

PHOTOACTIVE DEVICES AND MATERIALS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The application relates generally to the field of photoactive devices and materials and more particularly to methods for forming thin films comprising a dielectric transition metal compound phase and a conductive or semiconducting transition metal compound phase.

Description of the Related Art

Atomic layer deposition (ALD) is based on sequential, self-saturating surface reactions, which can provide good conformality and step coverage regardless of the geometry of the structure to be coated. However, deposition of metallic films by ALD has been challenging, in part because ALD is based essentially on thermodynamically favorable half-reactions.

Refractory metal conducting layers are basic building blocks in micro and nano-electronics. Oxidation resistant metal thin films are desirable in a number of contexts. For example, titanium nitride layers are commonly used in the semiconductor manufacturing industry, for example, as a gate electrode material or as a copper diffusion barrier. However, titanium nitride is known to oxidize from the surface when stored in air, likely through grain boundaries, up to depths of tens of nanometers.

Further, photoactive materials and/or electrically conductive photo transparent materials are useful in a wide variety of contexts. For example, photoactive materials can be used to convert radiant energy from photons into electrical energy and are important elements in, for example, solar cells.

SUMMARY OF THE INVENTION

In some embodiments atomic layer deposition (ALD) processes are provided for depositing thin films comprising a dielectric transition metal compound phase embedded in a conductive or semiconducting transition metal compound phase. In some embodiments the dielectric transition metal compound phase may comprise a transition metal oxide or a transition metal fluoride. In some embodiments the dielectric transition metal compound phase may comprise $TiF_3$. In some embodiments the conductive or semiconducting phase may comprise an elemental transition metal, a transition metal alloy, a transition metal oxide, a transition metal nitride, a transition metal silicide, and/or a transition metal carbide. In some embodiments the conductive or semiconducting transition metal compound phase may be TiN. In some embodiments the dielectric transition metal compound phase may be $TiF_3$ and the conductive or semiconducting transition metal compound phase may be TiN.

In some embodiments the dielectric transition metal compound phase may comprise discrete particles. In some embodiments the dielectric transition metal compound phase may comprise particles ranging from about 0.1 nm to about 500 nm in diameter. In some embodiments the conductive or semiconducting transition metal compound phase surrounds the dielectric transition metal compound phase particles.

In some aspects atomic layer deposition (ALD) processes are provided for depositing thin films comprising a dielectric transition metal compound phase and a conductive or semiconducting transition metal compound phase on a substrate in a reaction space. In some embodiments the ALD processes may comprise a plurality of super-cycles, where at least one super-cycle comprises two sub-cycles: a metal fluoride sub-cycle and a second sub-cycle. In some embodiments, the metal fluoride sub-cycle comprises contacting the substrate with a metal fluoride, and the second sub-cycle comprises alternately and sequentially contacting the substrate with a silane or borane and a nitrogen reactant. In some embodiments the second sub-cycle is referred to as a reducing sub-cycle and the substrate is contacted with a reducing agent and a nitrogen reactant. In some embodiments the substrate may comprise silicon.

According to some embodiments, the transition metal of the dielectric transition metal compound comprises a metal selected from Ti, Ta, Nb, Mo and W. In some embodiments the dielectric transition metal compound comprises a transition metal fluoride. In some embodiments, the transition metal fluoride comprises $TiF_4$. In some embodiments, the reducing agent is a silane or borane. In some embodiments, the reducing agent comprises disilane or trisilane. In some embodiments, the reducing agent comprises diborane or triborane. In some embodiments, the nitrogen reactant is selected from the group consisting of ammonia, $N_2H_4$, nitrogen atoms, nitrogen containing plasma and nitrogen radicals. In some embodiments, the transition metal fluoride is $TiF_4$ and the reducing agent is $Si_3H_8$. In some embodiments, the metal fluoride sub-cycle and the reducing sub-cycle are carried out at a ratio of at least about 0.1 in at least one of the plurality of super-cycles. In some embodiments, the thin film comprises $TiF_3$.

According to some embodiments a thin film comprising a dielectric transition metal compound phase and a conductive or semiconducting transition metal compound phase comprises about, 0.1 to about 10 at %, 0.1 to about 5 at % or 0.4 to about 2.3 at % silicon. In some embodiments, the thin film comprises, about 1 to about 50 at % nitrogen, about 5 to about 45 at % nitrogen, about 10 to about 50 at % nitrogen. In some embodiments, the thin film is conductive. In some embodiments, the thin film has a layer resistivity of less than about $10^7$ µΩcm. In some embodiments the thin film has a layer resistivity of between about 500 µΩcm and about $5×10^6$ µΩcm. In some embodiments the thin film has a layer resistivity of between about $5×10^3$ µΩcm and about $5×10^6$ µΩcm In some embodiments the thin film has a layer resistivity of between about $10^4$ µΩcm and about $10^6$ µΩcm. In some embodiments, the thin film is not oxidized by an air ambient at less than about 300° C.

In some embodiments the thin film comprises a mixture of a dielectric transition metal compound and a conductive or semiconducting transition metal compound. In some embodiments the thin film comprises a dielectric transition metal compound phase embedded in a conductive or semiconducting transition metal compound phase. In some embodiments the thin film comprises a mixture of $TiF_3$ and TiN.

In some embodiments the thin film is a photoactive material configured to absorb radiant energy of one or more photons to produce electrical energy. In some embodiments the thin film is transparent or partially transparent. In some embodiments the thin film is electrically conductive. In some embodiments the thin film comprises a waveguide configured to guide the propagation of an electromagnetic wave.

In some embodiments the thin film is configured to absorb at least a portion of light incident to the composite thin film to produce an electrical potential difference within the composite thin film. In some embodiments the thin film is electrically conductive and transparent to light, wherein at least a portion of light incident to a surface of the thin film passes through the thin film. In some embodiments the thin film is configured to transfer information contained in a modulated light beam incident to a surface of the thin film as electromagnetic waves within the thin film.

According to some embodiments, there is disclosed herein a thin film comprising a $TiF_3$ phase particles embedded in a TiN phase. In some embodiments, the thin film comprises about 5 to about 50 at % nitrogen. In some embodiments, the thin film comprises about 0.4 to about 2.3 at % silicon. In some embodiments, the thin film has a thickness of less than about 100 nm. In some embodiments, the thin film has a thickness of less than about 10 nm. In some embodiments the thin film may have a thickness of up to about 100 nm, up to about 1 am, or in some instances up to about 1 mm.

In some embodiments a thin film comprises a mixture of a dielectric transition metal compound and a conductive or semiconducting transition metal compound. In some embodiments the thin film comprises a dielectric transition metal compound phase embedded in a conductive or semiconducting transition metal compound phase. In some embodiments the thin film comprises a mixture of $TiF_3$ and TiN. In some embodiments the thin film is a photoactive material configured to absorb radiant energy of one or more photons to produce electrical energy in an electric circuit. In some embodiments the thin film is photo transparent or partially photon transparent. In some embodiments the composite thin film is electrically conductive. In some embodiments the thin film comprises a waveguide configured to guide the propagation of an electromagnetic wave.

In some embodiments the thin film is configured to absorb at least a portion of light incident to the thin film to produce an electrical potential difference within the composite thin film. In some embodiments the thin film is electrically conductive and transparent to light, wherein at least a portion of light incident to a surface of the thin film passes through the thin film. In some embodiments the thin film is configured to transfer information contained in a modulated light beam incident to a surface of the thin film as electromagnetic waves within the thin film.

According to some embodiments, there is disclosed herein a photonic device comprising a dielectric transition metal compound phase embedded in a conductive or semiconducting transition metal compound phase. As used herein the term photonic device may refer to components or devices that are capable of generating, detecting, absorbing, manipulating, or responding to photons, that is, light. The term photonic device may refer to, for example, laser diodes, light-emitting diodes, solar cells, and/or photovoltaic cells. In some embodiments the dielectric transition metal compound phase may comprise discrete particles. In some embodiments the dielectric transition metal compound phase may comprise particles from about 0.1 nm to about 500 nm. In some embodiments the conductive or semiconducting transition metal compound phase surrounds the dielectric transition metal compound phase particles.

In some embodiments the photonic device comprises a photoactive component, for example a photoelectrode. In some embodiments the photoactive component is configured to absorb radiant energy of photons to produce electrical energy in a circuit. In some embodiments the photoactive component is configured to produce photons with electrical energy. In some embodiments the photoactive component comprises a dielectric transition metal compound phase embedded in a conductive or semiconducting transition metal compound phase. In some embodiments the photoactive component comprises a semiconducting material. In some embodiments the photoactive component comprises Si, SiGe, Ge, CdTe, GaAs, GaSb, and/or InGaAs. In some embodiments the photoactive component comprises a mixture of $TiF_3$ and TiN.

In some embodiments the photonic device comprises a photon transparent component configured to allow a photon to pass through the photon transparent component. In some embodiments the photon transparent component comprises a dielectric transition metal compound phase embedded in a conductive or semiconducting transition metal compound phase. In some embodiments the photon transparent component comprises a mixture of $TiF_3$ and TiN.

In some embodiments the photonic device comprises a charge collecting component configured to collect photon excited charge carriers. In some embodiments the charge collecting component comprises a dielectric transition metal compound phase embedded in a conductive or semiconducting transition metal compound phase. In some embodiments the charge collecting component comprises indium tin oxide, doped tin oxide, zinc oxide, doped zinc oxide, conductive polymer, a metal grid, carbon nanotubes, graphene, or a nanowire thin film. In some embodiments the photon transparent component comprises a mixture of $TiF_3$ and TiN.

In some embodiments the photonic device comprises a waveguide component configured to transfer characteristics of a photon flux incident on at least a portion of the photonic device. In some embodiments the waveguide component comprises a dielectric transition metal compound phase embedded in a conductive or semiconducting transition metal compound phase.

BRIEF DESCRIPTION OF THE DRAWINGS

The invention will be better understood from the detailed description and from the appended drawings, which are meant to illustrate and not to limit the invention, and wherein.

DETAILED DESCRIPTION

Figure 1:
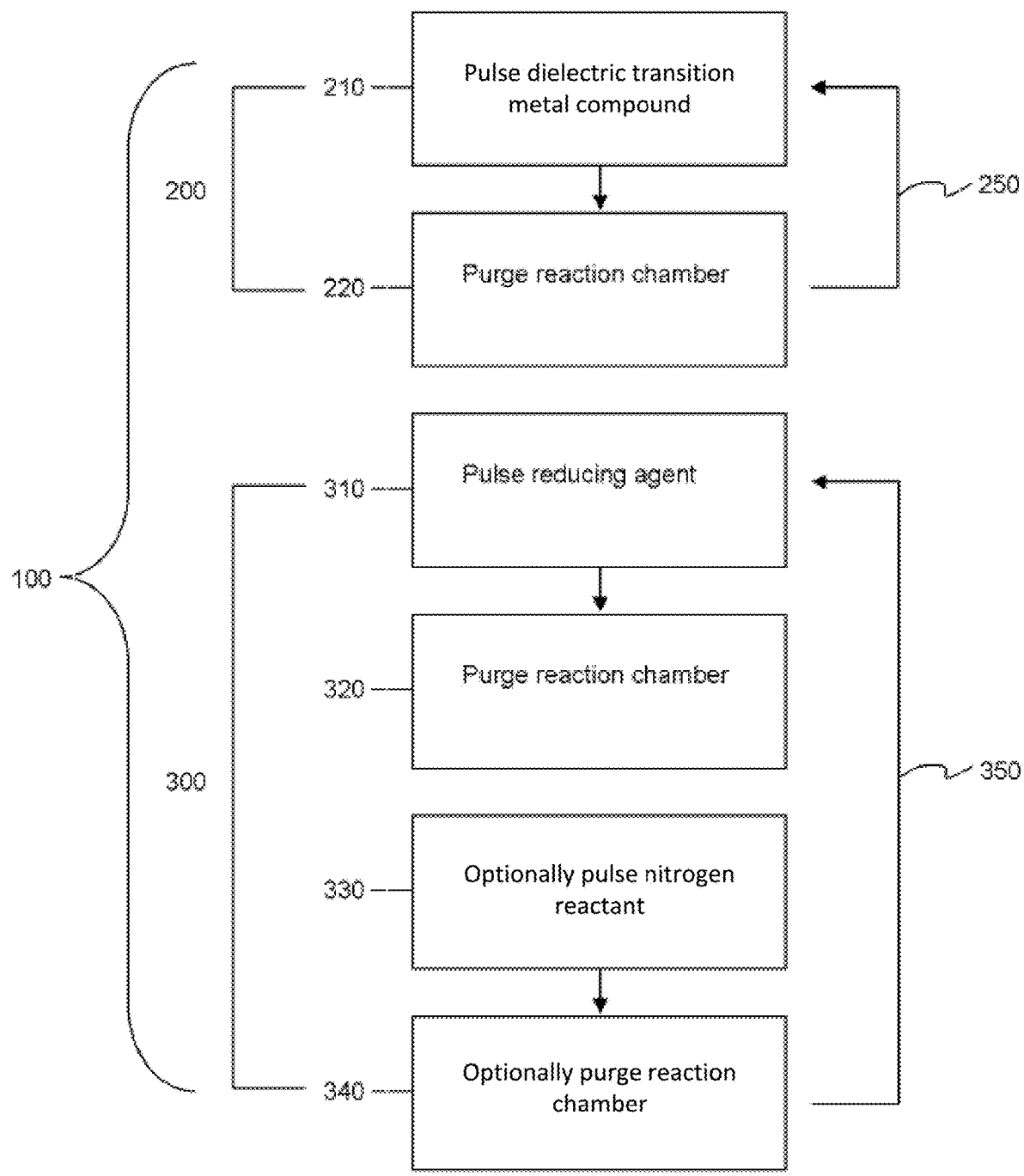
FIG. 1 is a flow chart illustrating an ALD process for depositing thin film comprising a dielectric transition metal compound phase and a conductive or semiconducting transition metal compound phase according to some embodiments.

Thin films comprising a dielectric transition metal compound phase, for example a metal fluoride or metal oxide phase embedded in a conductive or semiconducting transition metal compound phase may possess photoactive properties. For example, the resistance of such composite films may change upon exposure to light. In some embodiments such composite films may comprise discrete particles of a dielectric transition metal compound phase embedded in a conductive or semiconducting transition metal compound phase. In some embodiments the dielectric transition metal compound phase may comprise particles with ranging from about 0.1 nm to about 500 nm in diameter. In some embodiments the conductive or semiconducting transition metal compound phase surrounds the dielectric transition metal compound phase particles. For example, in some embodiments a composite film may comprise discrete $TiF_3$ particles embedded in TiN. In some embodiments the dielectric transition metal compound phase may comprise an oxide or fluoride. In some embodiments the dielectric transition metal compound comprises a transition metal oxide, transition metal fluoride, transition metal oxyfluoride or a mixture of one or more of these. In some embodiments the dielectric transition metal compound consists of a transition metal oxide, transition metal fluoride, transition metal oxyfluoride or a mixtures of one or more of these. In some embodiments the dielectric transition metal compound phase may be selected from a group consisting of: $TiF_3$, $Cr_2O_3$, NiO, $WO_3$, $Ti_2O_3$, $TiOF_2$, $NbO_2F$, $NbO_{3-x}F_x$, $NbO_{x/2}F_{3-x}$, $MoO_{3-x}F_x$, $MoO_xF_{3-x}$, $TaO_2F$, $TaO_xF_{3-x}$, $WO_{3-x}F_x$. In some embodiments the dielectric transition metal compound phase comprises: $TiF_3$, $Cr_2O_3$, NiO, $WO_3$, $Ti_2O_3$, $TiOF_2$, $NbO_2F$, $NbO_{3-x}F_x$, $NbO_{x/2}F_{3-x}$, $MoO_{3-x}F_x$, $MoO_xF_{3-x}$, $TaO_2F$, $TaO_xF_{3-x}$ or $WO_{3-x}F_x$ or a mixture of one or more these. In some embodiments the dielectric transition metal compound phase has an $ReO_3$-like structure. In some embodiments the dielectric transition metal compound phase comprises a crystal structure similar to the crystal structure $ReO_3$. The term $ReO_3$-like structure is not intended to limit the dielectric transition metal compound phase to $ReO_3$, it is used for simplicity to illustrate that the dielectric transition metal compound phase may comprise a crystal structure similar to the crystal structure of $ReO_3$ (rhenium (IV) oxide). The exemplary $ReO_3$-like crystal structure may also be conceived of as a perovskite ($ABO_3$) type crystal structure that is missing the large A cation at the center of the unit cell. The $ReO_3$-like crystal structure is a cubic structure with a metal atom at each corner of the unit cell and one non-metal atom, such as oxygen or fluorine, on each unit cell edge approximately midway between the metal atoms. In some embodiments the $ReO_3$-like structure comprises a structure distorted from the ideal $ReO_3$-like structure. In some embodiments the dielectric transition metal compound comprises a Pm3m {221} space group, such as a $ReO_3$-like structure.

In some embodiments the conductive or semiconducting transition metal compound phase may comprise elemental metal, such as transition metal, metal alloy, such as metal alloy comprising transition metal, metal nitride, such as transition metal nitride, metal carbide, such as transition metal carbide, or mixtures of two or more of those. In some embodiments the conductive or semiconducting transition metal compound phase may be selected from the group consisting of elemental metal, such as transition metal, metal alloy, such as metal alloy comprising transition metal, metal nitride, such as transition metal nitride, metal carbide, such as transition metal carbide, or mixtures of two or more of those. In some embodiments the conductive or semiconducting transition metal compound phase may comprise an element from period 4 of the periodic table of the elements. In some embodiments the conductive or semiconducting transition metal compound phase may be selected from a group consisting of: Cr, TiN, Fe, W, TiC, Ti, or a mixture of one or more of these. In some embodiments the conductive or semiconducting transition metal compound phase may comprises: Cr, TiN, Fe, W, TiC or Ti or a mixture of one or more of these.

The thin films comprising a dielectric transition metal compound phase and a conductive or semiconducting transition metal compound phase disclosed herein may be used in a variety of contexts. For example, a conductive fluoride film, or a conductive film comprising metal fluoride, such as a conductive thin film comprising $TiF_3$, may be used as an oxygen barrier film over a TiN layer or other metallic film. In some embodiments conductive fluorine-containing films formed according to the present disclosure would be useful as a barrier film against ashing or other oxidative conditions. In some embodiments, conductive fluorine-containing films formed according to the present disclosure may be used as a protective layer against ambient environments comprising oxygen, such as ambient air and/or water or moisture. In some embodiments, the conductive, fluorine-containing films of the present disclosure are useful as sacrificial layers, such as in patterning layers or in other applications where good oxidation resistance is desired. In some embodiments, a conductive fluoride thin film is deposited conformally over vertical and horizontal surfaces. In some embodiments, a conductive film comprising metal fluoride can be used as a p-type capping layer on a gate stack, for example on top of high-k layer, such as $HfO_2$, and below an actual gate electrode layer or a conductive gate dielectric barrier layer. In some embodiments, when a conductive film comprising metal fluoride is used as a p-type capping layer, the effective work function of the electrode in the stack is above about 4.9 eV, preferably between about 5.0 and about 5.2 eV.

The thin films comprising a dielectric transition metal compound phase and a conductive or semiconducting transition metal compound phase may also be used as, for example, a photoactive material in a variety of contexts. In some embodiments thin films formed according to the present disclosure may be used as a photoelectrode in a photoactive device. In some embodiments the thin film may absorb radiant energy of photons to produce electrical energy in a circuit. In some embodiments the thin film is deposited on a substrate comprising silicon. In some embodiments the thin film is deposited on a substrate comprising glass, quartz, and/or $SiO_2$. In some embodiments the substrate may comprise a silicon wafer or a portion thereof. In some embodiments the thin film is deposited on a typical substrate used in, for example, thin-film solar cell manufacturing, as will be apparent to one of skill in the art.

In some embodiments a thin film of the present disclosure may be used as photon transparent component in a photoactive device. In some embodiments thin films of the present disclosure may be used as a charge collecting component in a photoactive device. In some embodiments thin films of the present disclosure may be used as a waveguide component in a photoactive device. In some embodiments, the film comprising a dielectric transition metal compound phase and a conductive or semiconducting transition metal compound phase does not comprise one or more of the following materials: $MgF_2$, $CaF_2$, $ZnF_2$, $SrF_2$, $YF_3$, or $LaF_3$. In some embodiments, the film does not comprise one or more of the following materials: $AlF_3$ or LiF. In some embodiments, the film does not comprise one or more of the following materials: alkali metal fluorides (group 1 in periodic table of elements), such as KF or alkaline earth (group 2 in periodic table of elements) metal fluorides, such as $MgF_2$ or $CaF_2$. In some embodiments, the film does not comprise one or more of the following materials: group 3 metal fluorides, such as $YF_3$ or $LaF_3$. In some embodiments, the film does not comprise more than about 20 at %, preferably not more than about 10 at %, more preferably not more than about 5 at %, and most preferably not more than about 1 at % of one or more of the following metals: alkali metals, alkaline earth metals, and group 3 metals. In some embodiments, the film does not comprise more than about 20 at %, preferably not more than about 10 at %, more preferably not more than about 5 at %, and most preferably not more than about 1 at % of one or more of the following metals: Mg, Ca, Zn, Sr, Y, or La. In some embodiments, the film does not comprise more than about 20 at %, preferably not more than about 10 at %, more preferably not more than about 5 at %, and most preferably not more than about 1 at % of metals other than one or more of the following metals: Ti, Zr, Hf, V, Nb, Ta, Cr, Ni, Fe, Mo, or W, and preferably metals other than one or more of the following metals: Ti, Nb, Ta, Mo, and W. As discussed herein, thin films comprising a dielectric transition metal compound phase and a conductive or semiconducting transition metal compound phase can be deposited by vapor deposition processes, for example by atomic layer deposition (ALD). Such films can desirably be oxidation resistant, conductive, photoactive, and/or photon transparent. In some embodiments a thin film may comprise Titanium fluoride ($TiF_3$). $TiF_3$ is a stable, solid fluoride that can be used in a variety of contexts, for example in materials that form catalysts, photoactive material, photoelectrode, waveguide, charge collecting component, and/or photon transparent material.

The presence of fluorine in some metal thin films enhances oxidation resistance. Metal nitrides, such as titanium nitride, are commonly used in the semiconductor industry, for example as barrier films. However, as discussed above titanium nitride films can be subject to undesirable oxidation. The present application is based, in part, on the unexpected finding that a conductive thin film comprising metal fluoride, such as a conductive thin film comprising titanium fluoride, can be deposited. In some embodiments the titanium fluoride-containing film has greater oxidation resistance than a TiN film, such as a TiN film deposited by known vapor deposition processes, for example by ALD and/or CVD.

In some embodiments, vapor deposition processes are provided for depositing a thin film comprising a dielectric transition metal compound phase and a conductive or semiconducting transition metal compound phase on a substrate. In some embodiments a deposition process for depositing a thin film comprising a dielectric transition metal compound phase and a conductive or semiconducting transition metal compound phase on a substrate may comprise an atomic layer deposition (ALD) type process, a chemical vapor deposition (CVD) type process, or a combination or ALD and CVD type processes. In some embodiments, other processes, such as physical vapor deposition (PVD), plasma enhanced atomic layer deposition (PEALD), etc. may be used.

In some embodiments, the processes may comprise a first sub-cycle in which the substrate is exposed to a vapor phase dielectric transition metal compound, such as $TiF_4$, and a monolayer of dielectric transition metal compound is adsorbed on the substrate surface. In a second sub-cycle, a vapor phase silane or borane compound, or other "reducing agent", and a vapor phase nitrogen reactant are alternately and sequentially provided. The reducing agent and nitrogen reactant react with the dielectric transition metal compound on the substrate surface to form film comprising fluoride dielectric transition metal compound phase and a conductive or semiconducting transition metal compound phase. In some embodiments, a first sub-cycle may include both a vapor phase dielectric transition metal compound, such as $TiF_4$, and a reducing agent, such as a silane or a borane. In some embodiments, a second cycle does not include a silane or a borane. Thus, in some embodiments, a first cycle comprises a vapor phase dielectric transition metal compound and a silane or a borane, and a second cycle comprises a vapor phase nitrogen reactant. Although the term "reducing agent" is used, in some embodiments, chemical reduction is not required. Thus, in some embodiments the term "reducing agent" simply represents a silane compound or a borane compound. However, without being bound to any theory, it is believed that in some embodiments, a reducing agent as herein described might reduce the oxidative state of a metal species on the surface.

In some embodiments the metal may be selected from Ti, Ta, Nb, Mo, and W, for example. The reducing agent may be, for example, a silane or borane compound. The nitrogen reactant may be, for example, $NH_3$. In some embodiments where a nitrogen reactant is used, the nitrogen reactant may exhibit at least some reducing effect on the oxidation state of a metal species on the substrate surface.

The first and second sub-cycles together make an ALD super-cycle. In each super-cycle, the first sub-cycle and the second sub-cycle may be independently repeated one or more times. Further, the super-cycle may be repeated one or more times to deposit a conductive film comprising a dielectric transition metal compound phase and a conductive or semiconducting transition metal compound phase to a desired thickness. The first and second sub-cycles can be performed in any order. For example, in some embodiments the second sub-cycle may be performed first. Moreover, the order of the reactants in each sub-cycle may be varied. For example, in some embodiments, in the reducing sub-cycle—which may be performed first or second—the nitrogen reactant is pulsed before the silane or borane compound or vice versa.

The ratio of the first sub-cycle to the second sub-cycle within one or more super-cycles can be varied to deposit a film with a desired composition and/or desired properties. In some embodiments the ratio of the first sub-cycle to the second sub-cycle is the same in each super-cycle in the ALD process. In some embodiments the ratio of first sub-cycles to second sub-cycles may vary in one or more super-cycles during the deposition process.

In some embodiments a conductive thin film comprising fluoride dielectric transition metal compound phase and a conductive or semiconducting transition metal compound phase is formed that comprises some silicon or boron from the reducing compound and/or some nitrogen from the nitrogen reactant. For example, in some embodiments a conductive thin film comprising $TiF_3$ is deposited that contains some Si and some N.

All atomic percentage (i.e., at %) values provided herein exclude hydrogen for simplicity and because hydrogen is difficult to accurately analyze quantitatively. However, in some embodiments, if it is possible to analyze the hydrogen with reasonable accuracy, the hydrogen content of the films is less than about 20 at %, less than about 10 at % or less than about 5 at %.

In some embodiments, a silane is used as a reducing agent and the conductive film comprising fluoride dielectric transition metal compound phase and a conductive or semiconducting transition metal compound phase also comprises a small amount of silicon. For example, in some embodiments, the silicon content may be less than about 15 at %. In some embodiments the silicon content may be from about 0.01 to about 10 at %, from about 0.1 to about 5 at %, or from about 0.1 to about 2 at %. In some embodiments, the silicon content in a conductive film comprising metal fluoride is preferably less than about 1.5 at %.

In some embodiments a borane is used as a reducing agent and the conductive film comprising fluoride dielectric transition metal compound phase and a conductive or semiconducting transition metal compound phase also comprises a small amount of boron. For example, in some embodiments, the boron content may be less than about 15 at %. In some embodiments the boron content is from about 0.01 to about 10 at %, from about 0.1 to about 5 at %, or from about 0.1 to about 2 at %. In some embodiments, the boron content is less than about 1.5 at %.

In some embodiments, the films comprise a small amount of nitrogen. For example, in some embodiments, the nitrogen content may range from about 0.5 to about 50 at %, from about 1 to about 20 at %, or from about 2 to about 15 at %.

In some embodiments, the films comprise fluorine in an amount greater than about 10 at %, from about 20 to about 75 at %, from about 40 to about 70 at %, or from about 45 to about 65 at %.

In some embodiments, the films have a fluorine to titanium ratio (F/Ti (at %/at %)) of from about 0.25 to about 5, from about 0.5 to about 3, or from about 1 to about 2.5.

In some embodiments, the films may comprise a small amount of oxygen, despite the fact that the films are oxidation resistant. For example, in some embodiments, the oxygen content is less than about 2.5 at %, less than about 1.5 at %, less than about 1.0 at %, or even less than about 0.5 at %.

In some embodiments a thin film comprising fluoride dielectric transition metal compound phase and a conductive or semiconducting transition metal compound phase and deposited by an ALD process as described herein has a greater oxidation resistance than a corresponding metal nitride film deposited by a known vapor deposition process, such as by ALD. In some embodiments a thin film deposited by an ALD process as described herein is a photoactive material.

In some embodiments, the thin films absorb at least a portion of light incident to a surface of the film to produce electrical potential differences within the film, or electrical current flow within the film. In some embodiments the thin film are phototransparent or photon transparent, that is the thin film allow at least a portion of light incident to a surface of the film to pass through the film. In some embodiments thin film transfers information contained in a modulated beam of light incident on a surface of the film by means of electromagnetic waves within the film.

In some embodiments a conductive thin film comprising $TiF_3$ is deposited by an ALD process comprising a first sub-cycle for adsorbing $TiF_4$ on a substrate surface in a self-limiting manner and a second sub-cycle for reducing the $TiF_4$ to $TiF_3$. For example $TiF_4$ may be provided in a first sub-cycle such that up to a monolayer of $TiF_4$ forms on a substrate surface. The first sub-cycle may be repeated two or more times. In some embodiments, a purge step is included between respective first sub-cycles. In the second sub-cycle the substrate is alternately and sequentially exposed to a reducing agent, such as a silane or a borane compound, and a nitrogen reactant, such as ammonia. The second sub-cycle serves to reduce at least a portion of the $TiF_4$ on the substrate surface to $TiF_3$. In some embodiments, the films formed comprise $TiF_3$ with relatively small amounts of silicon or boron and nitrogen. In some embodiments, the films formed comprise a mixture of $TiF_3$ and some nitrogen. In some embodiments the film is a mixture of $TiF_3$ and TiN. In some embodiments the film comprises a dielectric transition metal compound phase embedded in a conductive or semiconducting transition metal compound phase, for example a $TiF_3$ phase embedded in a TiN phase. In some embodiments the dielectric transition metal compound phase is in discrete from, such as discrete particles, and is surrounded by the conductive or semiconducting transition metal compound phase.

Each of the first and second sub-cycles may be repeated one or more times in a super-cycle. The super-cycle is repeated until a film of the desired thickness is achieved. By adjusting the ratio of the two sub-cycles in one or more super-cycles, the quantity of $TF_3$ can be increased without introducing an undesirable amount of silicon or nitrogen. In particular, in some embodiments increasing the number of second sub-cycles in which the substrate is alternately and sequentially contacted with the reducing agent and the nitrogen reactant, relative to the first sub-cycle, increases the amount of $TiF_4$ that is converted to $TiF_3$.

In some embodiments the reducing (second) sub-cycle may utilize a silicon compound; however, other compounds may be used. In some embodiments, the silicon compound is a silane compound, such as $SiH_4$, $Si_2H_6$, or $Si_3H_8$. In some embodiments, a boron compound may be used in at least one reducing sub-cycle. For example, in some embodiments, the reducing agent may be a borane compound, such as one or more of $BH_3$, $B_2H_6$, or triborane. It will be appreciated that other reducing agents may also be used. In some embodiments the same reducing agent is used in each sub-cycle, while in other embodiments different reducing agents may be utilized in one or more sub-cycles.

In some embodiments the nitrogen reactant may comprise one or more of $NH_3$, nitrogen atoms, nitrogen radicals, nitrogen plasma, other excited species comprising nitrogen that can, for example, be generated by a plasma, or other suitable nitrogen-containing compounds.

In some embodiments a thin film comprising $TiF_3$ is deposited that has a greater oxidation resistance than a TiN film deposited by known vapor deposition processes that do not incorporate fluorine in the film, such as a TiN film deposited by ALD.

In some embodiments a thin film comprising fluorine, such as a metal fluoride thin film comprising at least some nitrogen, is deposited that is smooth and does not have a columnar grain structure. In some embodiments a thin film is deposited comprising dielectric transition metal compound phase particles embedded in a conductive or semiconducting transition metal compound phase. In some embodiments the dielectric transition metal compound phase particles have clear grain boundaries with the conductive or semiconducting transition metal compound phase. In some embodiments the dielectric transition metal compound phase particles comprise discrete particles surrounded by the conductive or semiconducting transition metal compound phase. In some embodiments the dielectric transition metal compound phase particles are less than about 500 nm in diameter, preferably less than about 100 nm in diameter, more preferably less than about 20 nm in diameter. In some embodiments the dielectric transition metal compound phase particles may be less than 10 nm in diameter. In some embodiments the average distance between the dielectric transition metal compound particles is less than about 50 nm, preferably less than about 20 nm. In some embodiments the average distance between the dielectric transition metal compound particles is from about 10 nm to about 20 nm. In some embodiments the dielectric transition metal compound particles comprise columnar grains. In some embodiments the columnar grains extend substantially throughout the thickness of the deposited thin film.

In some embodiments a thin film comprising $TiF_3$ with a thickness of about 500 nm or less is deposited. In some embodiments the thin film has a thickness of less than about 100 nm, less than about 50 nm, less than about 30 nm, or less than about 10 nm. In some embodiments the thickness can be selected depending on the application where the film would be used. For example in some embodiments, the thickness of the film could be much less than described above, for example, from about 2 to about 50 Å, from about 3 to about 30 Å, and in some cases from about 5 to about 20 Å. In some embodiments the thin film may have a thickness of more than about 100 nm, more than about 1 μm, or in some instances more than about 1 mm.

While illustrated primarily in the context of forming thin films comprising $TiF_3$, other dielectric transition metal compound films or films containing at least some of a dielectric transition metal compound can be deposited using a deposition super-cycle, for example an ALD or CVD super-cycle, comprising at least one sub-cycle in which a transition metal compound reactant is utilized. For example in some embodiments a metal nitride film comprising two different metals and fluorine may be deposited by a deposition process comprising a first sub-cycle in which a substrate is alternately and sequentially contacted with a first metal reactant and a first nitrogen reactant and a second sub-cycle in which the substrate is alternately and sequentially contacted with a metal fluoride and a reducing agent, such as a silane or borane. Exemplary processes are described, for example, in U.S. application Ser. No. 13/802,157, which is incorporated by reference herein in its The deposition processes described herein can be used to deposit films comprising metal fluoride, which can be referred to as MF films, such as films comprising titanium fluoride. The stoichiometry, and thus the relative amounts of M and F can vary. For example, the relative amounts of Ti and F in a film comprising titanium fluoride can vary. Further, as discussed above, in some embodiments the films can comprise two different metals. The amount of each element in the film can be controlled, for example by controlling the ratio of the sub-cycles in the deposition processes.

For example, in some embodiments for forming films comprising $TiF_3$, increasing the number of reducing sub-cycles relative to the titanium fluoride sub-cycles may reduce the amount of $TiF_4$ in the film while increasing the amount of $TiF_3$ in the film. In some embodiments, the titanium fluoride to reducing sub-cycle ratio is less than or equal to about 1 and $TiF_3$ films with a nitrogen content of less than about 10 at.-% can be produced. As the titanium fluoride to reducing sub-cycle ratio increases, the amount of fluoride generally in the film increases and the relative $TiF_3$ content increases and the nitrogen content may also decrease. Without being bound to any theory, it is believed that in some circumstances a solid solution may be formed.

Deposition Processes

In some embodiments a thin film as described herein may be deposited by an atomic layer deposition (ALD) type process, a chemical vapor deposition (CVD) type process, or a combination or ALD and CVD type processes. In some embodiments, other processes, such as physical vapor deposition (PVD), plasma enhanced atomic layer deposition (PEALD), etc. may be used.

Briefly, ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses.

Briefly, a substrate is loaded into a reaction chamber and is heated to a suitable deposition temperature, generally at lowered pressure. In some embodiments the substrate comprises a 300 mm silicon wafer. In some embodiments the substrate comprises a 450 mm wafer. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted or pulsed into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as when depositing layers over extremely high aspect ratio structures or other structures with complex surface morphology is needed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. In forming the thin films disclosed herein, such as films comprising $TiF_3$ embedded in TiN, two sub-cycles are repeated one or more times in each ALD super-cycle to deposit dielectric transition metal compound material, for example in the form of particles, and to deposit conductive or semiconducting transition metal compound material.

Additional reactants can also be supplied that aid in the deposition process. Such reactants can be provided either in their own pulses or along with precursor pulses, and can be used for example to provide a desired surface termination, or to strip or getter adhered ligands and/or free by-product. In some embodiments the additional reactants do not contribute any species to the growing film.

The precursors employed in the processes may be solid, liquid, or gaseous material under standard conditions (room temperature and atmospheric pressure), provided that they are in vapor phase before they are conducted into the reaction chamber and contacted with the substrate surface.

As mentioned above, each pulse or phase of each cycle or sub-cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. In some embodiments the deposition processes described herein may comprise partially CVD-type process or completely CVD-type processes. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

"Pulsing" a vaporized reactant onto the substrate means that the vapor is conducted into the chamber for a limited period of time. Typically, the pulsing time is from about 0.05 seconds to about 10 seconds. However, depending on the substrate type and its surface area, the pulsing time may be even higher than about 10 seconds.

As an example, for a 300 mm wafer in a single wafer ALD reactor, the precursors are typically pulsed for from about 0.05 seconds to about 10 seconds, more preferably for from about 0.1 seconds to about 5 seconds and most preferably for from about 0.3 seconds to about 3.0 seconds. However, pulsing times can be on the order of minutes in some cases. The optimum pulsing time can be readily determined by the skilled artisan based on the particular circumstances.

The mass flow rate of the metal precursor can be determined by the skilled artisan. In some embodiments, for example for deposition on 300 mm wafers, the flow rate of the reactants is preferably between about 1 sccm and about 1000 sccm, about 10 sccm to about 800 sccm, or about 50 sccm to about 500 sccm, without limitation.

The pulsing time and mass flow rate of each of the reactants can be selected independently. In some embodiments the pulsing time (and/or mass flow rates) of two or more of the reactants is the same, while in some embodiments the pulsing times (or mass flow rates) are different.

The pressure in the reaction chamber is typically from about 0.01 mbar to about 20 mbar, more preferably from about 1 mbar to about 10 mbar. However, in some cases the pressure will be higher or lower than this range, as can be readily determined by the skilled artisan depending on multiple parameters, such as the particular reactor being used, the process and the precursors.

Before starting the deposition of the film, the substrate may be heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan based on the particular circumstances.

In some embodiments, the deposition temperature is about 100° C. to about 700° C., about 200° C. to about 500° C., about 250° C. to about 400° C., or about 325° C. to about 375° C.

The processing time depends, in part, on the thickness of the layer to be produced, the composition of the film, the growth rate of the individual deposition sub-cycles and the overall growth rate.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used.

In some embodiments the reactor is a batch reactor capable of holding more than about 50 substrates, more than about 100 substrates, or more than about 125 substrates. In some embodiments the reactor is a mini-batch reactor and has from 2 to about 20 substrates, from 3 to about 15 substrates, or from 4 to about 10 substrates. In some embodiments, the substrate is a silicon wafer, such as a silicon wafer having a diameter of at least about 150 mm. In some embodiments the substrate is a silicon wafer having a diameter of at least about 200 mm, or at least about 300 mm. In some embodiments, the substrate could be a silicon wafer having a diameter of at least about 450 mm.

The ALD processes for depositing conductive films comprising metal fluoride described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

A stand-alone reactor can be equipped with a load-lock. In that case, it is not necessary to cool down the reaction space between each run.

In some embodiments, a CVD process is used in which two or more precursor materials are simultaneously contacted to a substrate within a reaction chamber. In some embodiments, for example, a metal fluoride precursor, a reducing agent, and a nitrogen reactant are provided simultaneously to a reaction chamber where they react on a heated substrate surface to form a thin film comprising a conductive or semiconducting transition metal compound phase and a dielectric transition metal compound phase. In some embodiments the composition and structure of the deposited thin film may be controlled by the relative flow rates of the metal fluoride precursor, reducing agent, and nitrogen reactant into the reaction space.

In some embodiments, a CVD process is used in which two or more precursor materials with different concentrations are simultaneously applied to a substrate within a reaction chamber. In some embodiments, a CVD process is used in which two or more precursor materials with different concentrations are applied at least partly simultaneously to a substrate within a reaction chamber. In some embodiments, a metal fluoride precursor, a reducing agent, and a nitrogen reactant are separately pulsed to a reaction chamber in a manner such that metal fluoride precursor pulse partly overlaps the following reducing agent, and/or nitrogen reactant precursor pulse or pulses. The reactants react on a heated substrate surface to form a thin film comprising a conductive or semiconducting transition metal compound phase and a dielectric transition metal compound phase. In some embodiments, a metal fluoride precursor, a reducing agent, and/or a nitrogen reactant are pulsed to the reaction chamber in a manner such that the reducing agent and/or nitrogen reactant pulse or pulses partly overlaps the following metal fluoride precursor pulse. The reactants react on a heated substrate surface in the reaction chamber to form a thin film comprising a conductive or semiconducting transition metal compound phase and a dielectric transition metal compound phase.

In some embodiments, a CVD process is used in which two or more precursor materials with low concentrations are simultaneously applied to a substrate within a reaction chamber. In some embodiments, a metal fluoride precursor, a reducing agent, and a nitrogen reactant with very low concentrations (for example to avoid gas phase reactions and enable surface controlled reactions) are provided simultaneously to a reaction chamber where they react on a heated substrate surface to form a thin film comprising a conductive or semiconducting transition metal compound phase and a dielectric transition metal compound phase.

In some embodiments, a CVD process is carried out at a substrate temperature of between about 100° C. to about 800° C., preferably between 200° C.-600° C. contacting times, removal times and precursor concentrations applied in the embodiments using CVD process containing deposition cycles can be selected on the basis what is disclosed in the case of ALD process deposition cycles described herein. For example, high concentration or substantially higher concentration of precursor may be, for example, the concentration applied in cycles in ALD processes and low concentration or substantially lower concentration may be, for example, less than $1/5$, or preferably less than $1/10$ of the concentration of precursor in ALD process. In some embodiments where precursors may partly simultaneously contact the substrate, the first precursor contacting step might overlap 50% or less, preferably 30% or less, with the following precursor contacting step.

Deposition of Thin Films Comprising Dielectric Transition Metal Compound Material in Conductive or Semiconducting Transition Metal Compound Material As mentioned above and discussed in detail below films comprising a dielectric transition metal compound phase embedded in a conductive or semiconducting transition metal compound phase can be deposited using a dielectric transition metal compound deposition sub-cycle and a reducing sub-cycle. In some embodiments the transition metal can be selected from Ti, Ta, Nb, Mo, and W. The two sub-cycles can be repeated at a desired ratio in a super-cycle to form a smooth and/or nanocrystalline film. In some embodiments the thin films, such as thin films comprising a dielectric transition metal compound phase, do not have a columnar grain structure. In some embodiments the thin films comprise a dielectric transition metal compound phase embedded in a conductive or semiconducting transition metal compound phase.

In some embodiments the deposition process is an ALD process. In some embodiments, the deposition process is a sequential or cyclic process, such as a sequential or pulsed CVD process utilizing the same precursor and conditions selections as an ALD process. In some embodiments the deposition process is a PECVD process. In some embodiments the deposition process is an LPCVD/RTCDV process. In some embodiments the deposition process has a step which is not self-limiting. In some embodiments the process may operate in a process condition regime close to CVD conditions or in some cases fully in CVD conditions.

In some embodiment a thin film comprising a dielectric transition metal compound phase is deposited by a process that may comprise multiple super-cycles, where each super-cycle comprises at least one DM (dielectric transition metal compound) sub-cycle and at least one reducing sub-cycle. The ratio of the DM and reducing sub-cycles in each super-cycle can be varied to achieve the desired composition, and the number of super-cycles can be selected to deposit a film comprising a dielectric transition metal compound phase of the desired thickness. In some embodiments, the number of each sub-cycle conducted consecutively in a super-cycle is limited such that a homogenous conductive thin film, such as a film comprising metal fluoride, is formed, where distinct layers of DM and CM (conductive or semiconducting transition metal compound) are not visible, for example, in a cross-section TEM or SEM image. In some embodiments the number of each sub-cycle conducted consecutively in a super-cycle is such that a thin film comprising a dielectric transition metal compound phase (DM) embedded in a conductive or semiconducting transition metal compound phase (CM) is formed, where distinct DM particles are visible in, for example, a cross-section TEM or SEM image.

The super-cycle can be written as:

a[b(DM)+c(reducing agent+nitrogen compound)], where DM represents a dielectric transition metal compound sub-cycle and b is the number of DM sub-cycles in each super-cycle; (reducing agent+nitrogen compound) represents the reducing sub-cycles and c is the number of reducing sub-cycles in each super-cycle; and a is the number of super-cycles. The ratio of dielectric transition metal compound to reducing sub-cycles can be given as b:c.

The first and second deposition sub-cycles (b and c) may be provided at a selected ratio to deposit a thin film with a desired composition and desired properties. For example, in some embodiments, the ratio of the first, dielectric transition metal compound deposition sub-cycle to the second reducing sub-cycle (b:c) in one or more super-cycles may be from about 0.01 to about 100, about 0.05 to about 50 or about 0.1 to about 1. In some embodiments, the ratio of dielectric transition metal compound adsorption sub-cycles to reducing sub-cycles in one or more super-cycles is less than one. In some embodiments, the ratio of dielectric transition metal compound adsorption sub-cycles to reducing sub-cycles in one or more super-cycles is between about 1 and about 3. In some embodiments, the ratio of dielectric transition metal compound adsorption sub-cycles to reducing sub-cycles in one or more super-cycles is between about 1 and about 50, between about 3 and about 30 or between about 5 and about 20. In some embodiments, the ratio of dielectric transition metal compound adsorption sub-cycles to reducing sub-cycles in one or more super-cycles is about 0.5, about 1, about 3, about 5, about 10, about 20, about 40 or about 50.

In some embodiments, the ratio of first dielectric transition metal compound adsorption sub-cycles to second reducing sub-cycles (b:c) is the same in all of the complete super-cycles performed in the process. In other embodiments, the specific ratio of first dielectric transition metal compound adsorption sub-cycles to second reducing sub-cycles can be varied in different complete super-cycles. The specific ratios can be selected by the skilled artisan to provide the desired amounts of dielectric transition metal compound phase and conductive or semiconducting transition metal compound phase in the film and thus to achieve a film with desired properties.

Although referred to as the first dielectric transition metal compound adsorption sub-cycle and the second reducing sub-cycle, in some embodiments one or more super-cycles begins with the reducing sub-cycle, which is followed (after repeating a desired number of times) by the dielectric transition metal compound adsorption sub-cycle (which may also be repeated a desired number of times before beginning another super-cycle).

In some embodiments, the super-cycle can be written as:

a[b(DM+reducing agent)+c(nitrogen reactant)], where b is the number of DM sub-cycles—which includes a reducing agent—in each super-cycle; c is the number of nitrogen reactant sub-cycles in each super-cycle; and a is the number of super-cycles. The ratio of dielectric transition metal compound to nitrogen sub-cycles can be given as b:c.

In some embodiments, the metal, or M, comprises Ti, Ta, Nb, Mo, or W.

In some embodiments, the reducing agent comprises a silane or a borane. In some embodiments, the reducing agent is silane, disilane, or trisilane. In some embodiments, the reducing agent is borane, diborane, or triborane. As mentioned above, although referred to as a "reducing agent," in some embodiments it is not necessary that actual chemical reduction takes place. Similarly, in some embodiments reduction does not necessarily take place in a "reducing sub-cycle."

In some embodiments the nitrogen-precursor can be selected from the group consisting of ammonia, $N_2H_4$, nitrogen atoms, nitrogen-containing plasma or nitrogen radicals or other species generated in a plasma.

In some embodiments a thermal ALD process is used for depositing a fluoride film and the N-precursor is ammonia or $N_2H_4$. In some embodiments a plasma ALD process is used and the N-precursor for depositing a conductive, fluoride-containing film comprises nitrogen atoms, nitrogen-containing plasma, or nitrogen radicals.

Specific process conditions and parameters are provided below for deposition of exemplary thin films comprising $TiF_3$, thin films comprising $TiF_3$ embedded in TiN, though the process conditions described with respect to these processes can be applied to the deposition of other films comprising a dielectric transition metal compound phase.

In some embodiments, the first and second deposition sub-cycles are performed at same reaction temperature. In some embodiments the deposition temperature for one or both of the dielectric transition metal compound and reducing sub-cycles is about 100° C. to about 700° C., about 200° C. to about 500° C., about 250° C. to about 400° C., or about 325° C. to about 375° C. In some embodiments both the $TiF_4$ and reducing sub-cycles are carried out at about 350° C.

In some embodiments the ratio of dielectric transition metal compound sub-cycles to reducing sub-cycles is selected to deposit a film that closes at very thin thicknesses, such as less than about 3 nm (where closed means that atoms of the underlying substrate are not detected at the outermost surface anymore, as determined, for example, by LEIS). In some embodiments the ratio of sub-cycles is selected such that the film is electrically continuous, i.e., conducts current at very thin thicknesses, such as less than about 3 nm, less than about 2 nm, less than about 1.5 nm, or even less than about 1.0 nm. In some embodiments the ratio of sub-cycles is selected such that the film is continuous as a layer, but may contain some non-continuous features, such as holes, in the continuous matrix at very thin thicknesses, such as less than about 3 nm, less than about 2 nm, less than about 1.5 nm, or even less than about 1.0 nm. In some embodiments the ratio of sub-cycles is selected such that the film is not closed and may not be continuous, but still acts as a diffusion barrier at very thin thicknesses, such as less than about 3 nm, less than about 2 nm, less than about 1.5 nm, or even less than about 1.0 nm.

In some embodiments the ratio of dielectric transition metal compound sub-cycles to reducing sub-cycles is selected to deposited a film that is photoactive, for example a film that can absorb radiant energy of one or more photons to produce electrical energy in an electric circuit. In some embodiments the ratio of dielectric transition metal compound sub-cycle to reducing sub-cycles is selected to deposit a thin film that will absorb at least a portion of light incident to the thin film to produce an electrical potential difference within the thin film. In some embodiments the ratio of dielectric transition metal compound sub-cycle to reducing sub-cycles is selected to deposit a thin film that is electrically conductive and transparent to light, for example at least a portion of light incident to a surface of the thin film passes through the thin film. In some embodiments the ratio of dielectric transition metal compound sub-cycle to reducing sub-cycles is selected to deposit a thin film that can act as a waveguide, for example a film that can transfer information contained in a modulated light beam incident to a surface of the thin film as electromagnetic waves within the thin film.

In some embodiments, increasing the relative number of reducing sub-cycles in each super-cycle increases the sheet resistance and/or resistivity of the film comprising a dielectric transition metal compound phase and a conductive or semiconducting transition metal compound phase.

In some embodiments, a film comprising a dielectric transition metal compound phase and a conductive or semiconducting transition metal compound phase formed according the present disclosure may have a sheet resistance of less than about 200,000 Ω/sq, less than about 140,000 Ω/sq, less than about 20,000 Ω/sq, less than about 10,000 Ω/sq, less than about 1,000 Ω/sq, or even less than about 1,000 Ω/sq.

In some embodiments, a film comprising a dielectric transition metal compound phase and a conductive or semiconducting transition metal compound phase formed according the present disclosure may have a layer resistivity of less than about $10^7$ μΩcm. In some embodiments the thin film has a layer resistivity of between about 500 μΩcm and about $5 \times 10^6$ μΩcm. In some embodiments the thin film has a layer resistivity of between about $5 \times 10^3$ μΩcm and about $5 \times 10^6$ μΩcm In some embodiments the thin film has a layer resistivity of between about $10^4$ tμΩcm and about $10^6$ μΩcm. In some embodiments, the thin film is not oxidized by an air ambient at less than about 300° C.

In some embodiments, a film comprising a dielectric transition metal compound phase and a conductive or semiconducting transition metal compound phase formed according the present disclosure may have a layer resistivity of at least about 500 μΩcm, at least about 1,000 μΩcm, at least about 5,000 μΩcm, or even at least about 10,000 μΩcm. In some embodiments a film formed according to the present disclosure may comprise dielectric transition metal compound phase particles embedded in a conductive or semiconducting transition metal compound phase. In some embodiments the dielectric transition metal compound phase particles have clear grain boundaries with the conductive or semiconducting transition metal compound phase. In some embodiments the dielectric transition metal compound phase particles comprise discrete particles surrounded by the conductive or semiconducting transition metal compound phase. In some embodiments the dielectric transition metal compound phase particles are less than about 500 nm in diameter, preferably less than about 100 nm in diameter, more preferably less than about 20 nm in diameter. In some embodiments the dielectric transition metal compound phase particles may be less than 10 nm in diameter. In some embodiments the average distance between the dielectric transition metal compound phase particles is less than about 50 nm, preferably less than about 20 nm. In some embodiments the average distance between the dielectric transition metal compound phase particles is from about 10 nm to about 20 nm. In some embodiments the dielectric transition metal compound phase particles comprise columnar grains. In some embodiments the columnar grains extend substantially throughout the thickness of the deposited thin film.

In some embodiments a film comprising a dielectric transition metal compound phase and a conductive or semiconducting transition metal compound phase is deposited on a substrate comprising silicon. In some embodiments the film is deposited on a substrate comprising at least one of Si, SiGe Ge, CdTe, GaAs, GaSb, InGaAs or some other semiconducting material.

In some embodiments, a film comprising a dielectric transition metal compound phase and a conductive or semiconducting transition metal compound phase formed according the present disclosure may exhibit substantially no oxidation at temperatures below about 500° C., below about 400° C., below about 300° C., or below about 250° C. in an atmosphere containing oxygen. In some embodiments, the films are resistant to oxidation for prolonged periods in room temperature or temperatures naturally occurring outdoors, such as from about −50° C. to about 50° C., in oxygen containing atmospheres such as ambient air. For example, according to some embodiments, films formed according the present methods may be resistant to oxidation resistance for more than 6 hours, preferably more than 24 hours, and, in some cases, depending on the film composition, the films could be resistant to oxidation for periods of more than 10 days, preferably more than 30 days, and, in some cases, if desired, more than 1 year. In some embodiments films formed according to the present disclosure may be resistant to oxidation for more than 10 years, or more than 20 years in an ambient atmosphere. Exposure to, for example, ambient air might occur in some particular applications, for example, in case the film comprising metal fluoride is used as protective layer against ambient air which can comprise also moisture/water. Other atmospheres containing oxygen could include oxygen atoms, plasma or radicals, ozone, water/moisture, or other species containing OH-groups.

Deposition of Thin Films Comprising Metal Fluoride

As mentioned above and discussed in detail below films comprising metal fluoride, for example films comprising a metal fluoride phase embedded in a conductive or semiconducting transition metal compound phase can be deposited using a metal fluoride deposition sub-cycle and a reducing sub-cycle. In some embodiments the metal can be selected from Ti, Ta, Nb, Mo, and W. The two sub-cycles can be repeated at a desired ratio in a super-cycle to form a smooth and/or nanocrystalline film. In some embodiments the thin films, such as thin films comprising metal fluoride, do not have a columnar grain structure. In some embodiments the thin films comprise a dielectric transition metal fluoride phase embedded in a conductive or semiconducting transition metal compound phase.

In some embodiments the deposition process is an ALD process. In some embodiments, the deposition process is a sequential or cyclic process, such as a sequential or pulsed CVD process utilizing the same precursor and conditions selections as an ALD process. In some embodiments the deposition process is a PECVD process. In some embodiments the deposition process is an LPCVD/RTCDV process. In some embodiments the deposition process has a step which is not self-limiting. In some embodiments the process may operate in a process condition regime close to CVD conditions or in some cases fully in CVD conditions.

In some embodiment a thin film comprising metal fluoride is deposited by a process that may comprise multiple super-cycles, where each super-cycle comprises at least one MF (metal fluoride) sub-cycle and at least one reducing sub-cycle. The ratio of the MF and reducing sub-cycles in each super-cycle can be varied to achieve the desired composition, and the number of super-cycles can be selected to deposit a fluorine-containing film of the desired thickness. In some embodiments, the number of each sub-cycle conducted consecutively in a super-cycle is limited such that a homogenous conductive thin film, such as a film comprising metal fluoride, is formed, where distinct layers of MF and MN are not visible, for example, in a cross-section TEM or SEM image. In some embodiments the number of each sub-cycle conducted consecutively in a super-cycle is such that a thin film comprising a dielectric transition metal fluoride phase (MF) embedded in a conductive or semiconducting transition metal compound phase (MN) is formed, where distinct MF particles are visible in, for example, a cross-section TEM or SEM image.

The super-cycle can be written as:

a[b(MF)+c(reducing agent+nitrogen compound)], where MF represents a $M_xF_y$ sub-cycle and b is the number of MF sub-cycles in each super-cycle; (reducing agent+nitrogen compound) represents the reducing sub-cycles and c is the number of reducing sub-cycles in each super-cycle; and a is the number of super-cycles. The ratio of metal fluoride to reducing sub-cycles can be given as b:c.

The first and second deposition sub-cycles (b and c) may be provided at a selected ratio to deposit a thin film with a desired composition and desired properties. For example, in some embodiments, the ratio of the first, metal fluoride deposition sub-cycle to the second reducing sub-cycle (b:c) in one or more super-cycles may be from about 0.01 to about 100, about 0.05 to about 50 or about 0.1 to about 1. In some embodiments, the ratio of metal fluoride adsorption sub-cycles to reducing sub-cycles in one or more super-cycles is less than one. In some embodiments, the ratio of metal fluoride adsorption sub-cycles to reducing sub-cycles in one or more super-cycles is between about 1 and about 3. In some embodiments, the ratio of metal fluoride adsorption sub-cycles to reducing sub-cycles in one or more super-cycles is between about 1 and about 50, between about 3 and about 30 or between about 5 and about 20. In some embodiments, the ratio of metal fluoride adsorption sub-cycles to reducing sub-cycles in one or more super-cycles is about 0.5, about 1, about 3, about 5, about 10, about 20, about 40 or about 50.

In some embodiments, the ratio of first metal fluoride adsorption sub-cycles to second reducing sub-cycles (b:c) is the same in all of the complete super-cycles performed in the process. In other embodiments, the specific ratio of first metal fluoride adsorption sub-cycles to second reducing sub-cycles can be varied in different complete super-cycles. The specific ratios can be selected by the skilled artisan to provide the desired amounts of metal, fluoride, and nitrogen in the film and thus to achieve a film with desired properties.

Although referred to as the first metal fluoride adsorption sub-cycle and the second reducing sub-cycle, in some embodiments one or more super-cycles begins with the reducing sub-cycle, which is followed (after repeating a desired number of times) by the metal fluoride adsorption sub-cycle (which may also be repeated a desired number of times before beginning another super-cycle).

In some embodiments, the super-cycle can be written as:

a[b(MF+reducing agent)+c(nitrogen reactant)], where b is the number of MF sub-cycles—which includes a reducing agent—in each super-cycle; c is the number of nitrogen reactant sub-cycles in each super-cycle; and a is the number of super-cycles. The ratio of metal fluoride to nitrogen sub-cycles can be given as b:c.

In some embodiments, the metal, or M, comprises Ti, Ta, Nb, Mo, or W.

In some embodiments, the reducing agent comprises a silane or a borane. In some embodiments, the reducing agent is silane, disilane, or trisilane. In some embodiments, the reducing agent is borane, diborane, or triborane. As mentioned above, although referred to as a "reducing agent," in some embodiments it is not necessary that actual chemical reduction takes place. Similarly, in some embodiments reduction does not necessarily take place in a "reducing sub-cycle."

In some embodiments the nitrogen-precursor can be selected from the group consisting of ammonia, $N_2H_4$, nitrogen atoms, nitrogen-containing plasma or nitrogen radicals or other species generated in a plasma.

In some embodiments a thermal ALD process is used for depositing a fluoride film and the N-precursor is ammonia or $N_2H_4$. In some embodiments a plasma ALD process is used and the N-precursor for depositing a conductive, fluoride-containing film comprises nitrogen atoms, nitrogen-containing plasma, or nitrogen radicals.

Specific process conditions and parameters are provided below for deposition of exemplary thin films comprising $TiF_3$, thin films comprising $TiF_3$ embedded in TiN, though the process conditions described with respect to these processes can be applied to the deposition of other films comprising fluoride.

In some embodiments, the first and second deposition sub-cycles are performed at same reaction temperature. In some embodiments the deposition temperature for one or both of the metal fluoride and reducing sub-cycles is about 100° C. to about 700° C., about 200° C. to about 500° C., about 250° C. to about 400° C., or about 325° C. to about 375° C. In some embodiments both the $TiF_4$ and reducing sub-cycles are carried out at about 350° C.

In some embodiments the ratio of metal fluoride sub-cycles to reducing sub-cycles is selected to deposit a film that closes at very thin thicknesses, such as less than about 3 nm (where closed means that atoms of the underlying substrate are not detected at the outermost surface anymore, as determined, for example, by LEIS). In some embodiments the ratio of sub-cycles is selected such that the film is electrically continuous, i.e., conducts current at very thin thicknesses, such as less than about 3 nm, less than about 2 nm, less than about 1.5 nm, or even less than about 1.0 nm. In some embodiments the ratio of sub-cycles is selected such that the film is continuous as a layer, but may contain some non-continuous features, such as holes, in the continuous matrix at very thin thicknesses, such as less than about 3 nm, less than about 2 nm, less than about 1.5 nm, or even less than about 1.0 nm. In some embodiments the ratio of sub-cycles is selected such that the film is not closed and may not be continuous, but still acts as a diffusion barrier at very thin thicknesses, such as less than about 3 nm, less than about 2 nm, less than about 1.5 nm, or even less than about 1.0 nm.

In some embodiments the ratio of metal fluoride sub-cycles to reducing sub-cycles is selected to deposited a film that is photoactive, for example a film that can absorb radiant energy of one or more photons to produce electrical energy in an electric circuit. In some embodiments the ratio of metal fluoride sub-cycle to reducing sub-cycles is selected to deposit a thin film that will absorb at least a portion of light incident to the thin film to produce an electrical potential difference within the thin film. In some embodiments the ratio of metal fluoride sub-cycle to reducing sub-cycles is selected to deposit a thin film that is electrically conductive and transparent to light, for example at least a portion of light incident to a surface of the thin film passes through the thin film. In some embodiments the ratio of metal fluoride sub-cycle to reducing sub-cycles is selected to deposit a thin film that can act as a waveguide, for example a film that can transfer information contained in a modulated light beam incident to a surface of the thin film as electromagnetic waves within the thin film.

In some embodiments, increasing the relative number of reducing sub-cycles in each super-cycle increases the sheet resistance and/or resistivity of the metal fluoride film.

In some embodiments, a fluoride-containing film formed according the present disclosure may have a sheet resistance of less than about 200,000 Ω/sq, less than about 140,000 Ω/sq, less than about 20,000 Ω/sq, less than about 10,000 Ω/sq, less than about 1,000 Ω/sq, or even less than about 1,000 Ω/sq.

In some embodiments, a fluoride-containing film formed according the present disclosure may have a layer resistivity of less than about $10^7$ μΩcm. In some embodiments the thin film has a layer resistivity of between about 500 μΩcm and about $5×10^6$ μΩcm. In some embodiments the thin film has a layer resistivity of between about $5×10^3$ μΩcm and about $5×10^6$ μΩcm In some embodiments the thin film has a layer resistivity of between about $10^4$ μΩcm and about $10^6$ μΩcm. In some embodiments, the thin film is not oxidized by an air ambient at less than about 300° C.

In some embodiments, a fluoride-containing film formed according the present disclosure may have a layer resistivity of at least about 500 μΩcm, at least about 1,000 μΩcm, at least about 5,000 μΩcm, or even at least about 10,000 μΩcm In some embodiments a fluoride-containing film formed according to the present disclosure may comprise metal fluoride particles embedded in a conductive or semiconducting transition metal compound phase. In some embodiments the metal fluoride particles have clear grain boundaries with the conductive or semiconducting transition metal compound phase. In some embodiments the metal fluoride particles comprise discrete particles surrounded by the conductive or semiconducting transition metal compound phase. In some embodiments the metal fluoride particles are less than about 500 nm in diameter, preferably less than about 100 nm in diameter, more preferably less than about 20 nm in diameter. In some embodiments the metal fluoride particles may be less than 10 nm in diameter. In some embodiments the average distance between the metal fluoride particles is less than about 50 nm, preferably less than about 20 nm. In some embodiments the average distance between the metal fluoride particles is from about 10 nm to about 20 nm. In some embodiments the metal fluoride particles comprise columnar grains. In some embodiments the columnar grains extend substantially throughout the thickness of the deposited thin film.

In some embodiments a fluoride-containing film is deposited on a substrate comprising silicon. In some embodiments a fluoride-containing film is deposited on a substrate comprising at least one of Si, SiGe Ge, CdTe, GaAs, GaSb, InGaAs or some other semiconducting material.

In some embodiments, a film comprising metal fluoride formed according the present disclosure may have exhibit substantially no oxidation at temperatures below about 500° C., below about 400° C., below about 300° C., or below about 250° C. in an atmosphere containing oxygen. In some embodiments, the films are resistant to oxidation for prolonged periods in room temperature or temperatures naturally occurring outdoors, such as from about −50° C. to about 50° C., in oxygen containing atmospheres such as ambient air. For example, according to some embodiments, films formed according the present methods may be resistant to oxidation resistance for more than 6 hours, preferably more than 24 hours, and, in some cases, depending on the film composition, the films could be resistant to oxidation for periods of more than 10 days, preferably more than 30 days, and, in some cases, if desired, more than 1 year. In some embodiments films formed according to the present disclosure may be resistant to oxidation for more than 10 years, or more than 20 years in an ambient atmosphere. Exposure to, for example, ambient air might occur in some particular applications, for example, in case the film comprising metal fluoride is used as protective layer against ambient air which can comprise also moisture/water. Other atmospheres containing oxygen could include oxygen atoms, plasma or radicals, ozone, water/moisture, or other species containing OH-groups.

Deposition of Films Comprising Dielectric Transition Metal Compound Material in Conductive or Semiconducting Transition Metal Compound Material by ALD As mentioned above, in some embodiments an atomic layer deposition process for depositing films comprising a dielectric transition metal compound phase, such as thin films comprising a fluoride compound—embedded in a conductive or semiconducting transition metal compound phase may comprise multiple super-cycles, where each super-cycle comprises at least one dielectric transition metal compound phase (DM) sub-cycle and at least one reducing sub-cycle. In the DM sub-cycle the substrate is exposed to vapor phase dielectric transition metal compound, for example a metal fluoride, such that up to a monolayer adsorbs on the substrate surface. In the reducing sub-cycle the substrate is exposed to a reducing agent, such as a silane or borane and a nitrogen reactant. The ratio of the DM and reducing sub-cycles can be varied to achieve the desired composition, and the number of super-cycles can be selected to deposit a film comprising a dielectric transition metal compound phase of the desired thickness. The DM sub-cycle may precede the reducing sub-cycle and vice versa. Similarly, in the reducing cycle, the reducing agent may precede the nitrogen reactant and vice versa.

FIG. 1 illustrates an ALD process for forming a film comprising a dielectric transition metal compound phase and a conductive or semiconducting transition metal compound phase on a substrate in a reaction chamber comprising multiple ALD super-cycles 100. Each super-cycle comprises a first DM deposition sub-cycle 200 and a second reducing sub-cycle 300. The super-cycle 100 is repeated as many times as desired to deposit a thin film of the desired thickness. The ratio between sub-cycles 200 and 300 within the super-cycle 100 may be selected to achieve a film with the desired composition and properties.

The first dielectric transition metal compound deposition sub-cycle comprises:
  pulsing vaporized dielectric transition metal compound, such as a transition metal fluoride, into the reaction chamber 210 to form at most a molecular monolayer of the dielectric transition metal compound on the substrate and
  purging the reaction chamber 220 to remove excess dielectric transition metal compound and reaction by products, if any, and
  repeating 250 the pulsing and purging steps.

In some embodiments, the first deposition sub-cycle is repeated 1, 2, 3, 4, 5, 10, 20, 50, 100, or more times in succession. In some embodiments the first deposition sub-cycle is repeated no more than about 30-60 times consecutively, up to about 30 to 50 times consecutively, or up to about 40 times consecutively.

The atomic layer deposition super-cycle 100 for forming the thin film also comprises one or more second reducing sub-cycles 300. In some embodiments, the second reducing sub-cycle 300 comprises:

pulsing a vaporized reducing agent, such as disilane or trisilane, into the reaction chamber 310 to reduce at least some of the adsorbed dielectric transition metal compound, purging the reaction chamber 320 to remove excess reducing agent and reaction by products, if any, optionally providing a pulse of a nitrogen reactant, such as $NH_3$, into the reaction chamber 330, optionally purging the reaction chamber 340 to remove excess nitrogen reactant and any gaseous by-products, and repeating 350 at least the pulsing and purging steps 310 and 320.

In some embodiments, the second reducing sub-cycle 300 is repeated 1, 2, 3, 4, 5, 10, 20, 50, 100 or more times in succession. In some embodiments the second reducing sub-cycle is repeated about 3 to 6 times, or about 5 times.

The first and second sub-cycles 200,300 are repeated multiple times in a complete ALD super-cycle 100, and the complete ALD super-cycle 100 is repeated to form a thin film of a desired thickness comprising a desired concentration of dielectric transition metal compound phase.

In some embodiments, the number of times the first deposition sub-cycle 200 and second reducing sub-cycle 300 are repeated is the same in each complete ALD super-cycle 100. In other embodiments, the number of first and second sub-cycles 100, 200 varies in one or more complete ALD super-cycles 100. The number of first and second sub-cycles 100, 200 in each complete ALD super-cycle 100 and the total number of first and second sub-cycles 100, 200 and total ALD super-cycles 100 can be adjusted to achieve deposition of a thin film of a desired thickness and composition.

Although illustrated as beginning with the first deposition sub-cycle 200, each complete ALD cycle may begin and end with either the first 100 or second 200 sub-cycle. For example, each ALD super-cycle for forming the thin film can be started with the first dielectric transition metal compound deposition sub-cycle or the reducing sub-cycle. In some embodiments one or more super-cycles may begin with the reducing sub-cycle.

In some embodiments the thin film is deposited by ALD over a substrate surface to form a conformal thin film of 500 nm or less. In some embodiments the thickness of the film is less than 100 nm, less than about 50 or less than about 10 nm. Depending on the application the thickness could be much less, for example, from about 2 to about 50 Å, preferably from about 3 to about 30 Å and in some cases from about 5 to about 20 Å. In some embodiments, for example when a film comprising $TiF_3$ is used as a photo-electrode, the thickness of the film may be about 30 nm. In some embodiments the thin film may have a thickness of more than about 100 nm, more than about 1 µm, or in some instances more than about 1 mm.

Various modifications, omissions and additions may be made to the methods and structures described above without departing from the scope of the invention. All such modifications and changes are intended to fall within the scope of the invention, as defined by the appended claims.

Deposition of Films Comprising Dielectric Transition Metal Compound Material in Conductive or Semiconducting Transition Metal Compound Material by PVD In some embodiments the thin films as described herein comprising a dielectric transition metal compound material in a conductive or semiconducting transition metal compound material may deposited by physical vapor deposition (PVD) type processes. In some embodiments a thin film comprising a dielectric transition metal compound material and a conductive or semiconducting transition metal compound material can be deposited by a reactive sputtering deposition process. In some embodiments a reactive sputtering process may comprise using a target comprising an elemental transition metal. For example, a target may comprise a transition metal target, such as a titanium target. In some embodiments the deposition process may comprise generating a plasma in an atmosphere comprising nitrogen, fluorine and/or oxygen species.

In some embodiments the dielectric transition metal compound material may comprise, a solid transition metal fluoride, transition metal oxide, or transition metal oxyfluoride, or a mixture of one or more of these. In some embodiments the dielectric transition metal compound material may comprise $TiF_3$.

In some embodiments the conductive or semiconducting transition metal compound material may comprise a transition metal nitride. In some embodiments the conductive or semiconducting transition metal compound material may comprise TiN.

In some embodiments the thin film is deposited using a sputtering process, for example a reactive sputtering process. In some embodiments the sputtering process may comprise generating a plasma in an atmosphere comprising nitrogen and/or fluorine. In some embodiments the atmosphere may comprise nitrogen-containing species and/or fluorine containing species. In some embodiments the atmosphere may comprise, for example $N_2$, $NH_3$, and/or $F_2$.

In some embodiments a thin film comprising $TiF_3$ in TiN is deposited by a sputtering process, for example a reactive sputtering process. In some embodiments the sputtering process may comprise generating a plasma in an atmosphere comprising $N_2$ and/or $F_2$. In some embodiments the sputtering process may comprise generating a plasma in an atmosphere comprising $NH_3$ and/or $F_2$.

In some embodiments the composition of the atmosphere may be varied during the deposition process. For example the concentration of nitrogen-containing species and fluorine-containing species may be varied throughout the deposition process. In some embodiments the atmosphere may comprise nitrogen-containing species and may not comprise fluorine-containing species. In some embodiments the atmosphere may comprise fluorine-containing species and may not comprise nitrogen-containing species. In some embodiments, during the deposition process, the atmosphere may comprise nitrogen-containing species and may not comprise fluorine-containing species for at least a portion of the deposition process and may comprise fluorine-containing species and may not comprise nitrogen-containing species for at least a different portion of the deposition process, for example an earlier or later portion of the deposition process.

Deposition of Films Comprising Dielectric Transition Metal Compound Material in Conductive or Semiconducting Transition Metal Compound Material by ALD As mentioned above, in some embodiments an atomic layer deposition process for depositing films comprising dielectric transition metal compound material in conductive or semiconducting transition metal compound material may comprise multiple super-cycles, where each super-cycle comprises at least one transition metal compound sub-cycle and at least one second sub-cycle, such as reducing sub-cycle. In the transition metal compound sub-cycle the substrate is exposed to a vapor phase transition metal compound such that up to a monolayer adsorbs on the substrate surface. In the second sub-cycle, such as reducing sub-cycle, the substrate is exposed to other reactants, such as a reducing agent, for example silane or borane and/or third reactant, such as nitrogen reactant. The ratio of the transition metal compound and second sub-cycles can be varied to achieve a desired composition, and the number of super-cycles can be selected to deposit a film comprising a transition metal compound of the desired thickness. The transition metal compound sub-cycle may precede the second sub-cycle and vice versa. Similarly, in the second sub-cycle, such as the reducing sub-cycle, the reducing agent may precede the third reactant, such as a nitrogen reactant, and vice versa.

Deposition of Films Comprising $TiF_3$ by ALD

As mentioned above, in some embodiments an atomic layer deposition process for depositing films comprising $TiF_3$, such as thin films comprising a $TiF_x$ compound—such as $TiF_3$—embedded in a conductive or semiconducting transition metal compound phase—such as TiN—may comprise multiple super-cycles, where each super-cycle comprises at least one $TiF_4$ sub-cycle and at least one reducing sub-cycle. In the $TiF_4$ sub-cycle the substrate is exposed to vapor phase $TiF_4$ such that up to a monolayer adsorbs on the substrate surface. In the reducing sub-cycle the substrate is exposed to a reducing agent, such as a silane or borane and a nitrogen reactant. The ratio of the $TiF_4$ and reducing sub-cycles can be varied to achieve the desired composition, and the number of super-cycles can be selected to deposit a film comprising titanium fluoride of the desired thickness. The $TiF_4$ sub-cycle may precede the reducing sub-cycle and vice versa. Similarly, in the reducing cycle, the reducing agent may precede the nitrogen reactant and vice versa.

In some embodiments, the $TiF_4$ sub-cycle may include a reducing agent, such as a silane compound or a borane compound. And in some embodiments, the second sub-cycle does not include a silane or a borane compound.

The super-cycle can be written as:

a[b(titanium fluoride)+c(reducing agent+nitrogen reactant)], where (titanium fluoride) represents a $TiF_4$ sub-cycle and b is the number of $TiF_4$ sub-cycles in each super-cycle; (reducing agent+nitrogen reactant) represents a reducing sub-cycle and c is the number of reducing sub-cycles in each super-cycle; and a is the number of super-cycles. Although illustrated with the $TiF_4$ sub-cycle coming first in the super-cycle, in some embodiments, in one or more super-cycles, the reducing sub-cycle comes first. Thus in some embodiments the $TiF_4$ sub-cycle can be considered the first sub-cycle and the reducing sub-cycle can be considered the second sub-cycle, while in some embodiments the reducing sub-cycle can be considered the first sub-cycle and the $TiF_4$ sub-cycle can be considered the second sub-cycle.

Though, in some embodiments, the super-cycle can be written as:

a[b($TiF_4$+reducing agent)+c(nitrogen reactant)], where b is the number of $TiF_4$ sub-cycles—which includes a reducing agent—in each super-cycle; c is the number of nitrogen reactant sub-cycles in each super-cycle; and a is the number of super-cycles. The ratio of metal fluoride to nitrogen sub-cycles can be given as b:c.

In some embodiments the reducing agent can be a borane or silane, such as diborane, triborane, disilane, or trisilane. In some embodiments the reducing agent is disilane. In some embodiments the reducing agent is trisilane. In some embodiments the nitrogen reactant can be ammonia, $N_2H_4$, nitrogen atoms, nitrogen-containing plasma, or nitrogen radicals.

In some embodiments a super-cycle can be written as a[b($TiF_4$)+c($Si_2H_6$+$NH_3$)], where b is the number of $TiF_4$ sub-cycles in each super-cycle, c is the number of reducing sub-cycles in each super-cycle, and a is the number of super-cycles.

The ratio of $TiF_4$ to reducing sub-cycles can thus be given as b:c (or $TiF_4$:reducing). In some embodiments the ratio of sub-cycles is constant in each ALD super-cycle in the ALD process. In other embodiments the ratio of sub-cycles may be changed in one or more super-cycle. Unless indicated otherwise, when a ratio of sub-cycles is provided herein, it refers to the ratio of sub-cycles in a complete ALD process comprising multiple super-cycles.

In some embodiments, the first and second deposition sub-cycles are performed at same reaction temperature. In some embodiments the deposition temperature for one or both of the $TiF_4$ and reducing sub-cycles is about 100° C. to about 700° C., about 200° C. to about 500° C., about 250° C. to about 400° C., or about 325° C. to about 375° C. In some embodiments both the $TiF_4$ and reducing sub-cycles are carried out at about 350° C.

In some embodiments, the first and second sub-cycles are performed in the same reactor.

The first and second sub-cycles may be provided at a selected ratio to deposit a thin film with a desired composition and desired properties. For example, in some embodiments the ratio of the first, $TiF_4$ deposition sub-cycle to the second reducing sub-cycle in one or more ALD super-cycles may be from about 0.01 to about 100, about 0.05 to about 50 or about 0.1 to about 1. In some embodiments the ratio of $TiF_4$ deposition sub-cycles to reducing sub-cycles in one or more super-cycles is less than one. In some embodiments, the ratio of $TiF_4$ deposition sub-cycles to reducing sub-cycles in one or more super-cycles is between about 1 and about 3. In some embodiments the ratio of $TiF_4$ deposition sub-cycles to reducing sub-cycles in one or more super-cycles is between about 1 and about 50, between about 3 and about 30 or between about 5 and about 20. In some embodiments the ratio of $TiF_4$ deposition sub-cycles to reducing sub-cycles in one or more super-cycles is about 0.01, about 0.2, about 0.3, about 0.4, about 0.5, about 0.6, about 0.8 or about 1.

As mentioned above, the ratio of sub-cycles can be selected to achieve a desired composition and desired film properties. In some embodiments a greater percentage of the $TiF_4$ is converted to $TiF_3$ by increasing the number of reducing sub-cycles relative to the $TiF_4$ sub-cycles. In some embodiments the ratio of $TiF_4$ to reducing sub-cycles is increased to increase the sheet resistance and/or resistivity of the deposited film.

In some embodiments the ratio of first $TiF_4$ deposition sub-cycles to second reducing sub-cycles is the same in all of the complete ALD super-cycles performed in the ALD process. In other embodiments the specific ratio of first $TiF_4$ deposition sub-cycles to second reducing deposition sub-cycles can be varied in different complete ALD super-cycles. The specific ratios can be selected by the skilled artisan to provide the desired amounts of titanium, fluorine, nitrogen in the film and thus to achieve a film with the desired properties.

In some embodiments the film comprising $TiF_3$ that is deposited is a conductive film. In some embodiments a film comprising $TiF_3$ is deposited that has a greater oxidation resistance than a TiN film deposited by known vapor deposition processes that do not incorporate fluorine in the film, such as ALD (for example as measured at 300° C. in an air ambient).

In some embodiments a conductive film comprising $TiF_3$ is formed that comprises some silicon or boron from the reducing compound and some nitrogen from the nitrogen reactant. For example, in some embodiments a conductive film comprising $TiF_3$ is deposited that contains some Si and some N.

In some embodiments, a silane is used as a reducing agent and the film comprising $TiF_3$ also comprises a small amount of silicon. For example, in some embodiments, the silicon content may range from about 15 at %, preferably from about 0.01 to about 10 at %, more preferably from about 0.1 to about 5 at %, and most preferably from about 0.1 to about 2 at %. In some embodiments, the silicon content is preferably less than about 1.5 at %.

In some embodiments a borane is used as a reducing agent and the film comprising $TiF_3$ also comprises a small amount of boron. For example, in some embodiments, the boron content may range from less than about 15 at %, from about 0.01 to about 10 at %, from about 0.1 to about 5 at %, or from about 0.1 to about 2 at %. In some embodiments, the boron content is preferably less than about 1.5 at %.

In some embodiments, the films comprising $TiF_3$ also comprise a small amount of nitrogen. For example, in some embodiments, the nitrogen content may range from about 0.5 to about 50 at %, from about 1-20 at %, or from about 2 to about 15 at %.

In some embodiments, the films comprise fluorine in an amount greater than about 10 at %, preferably from about 20 to about 75 at %, from about 40 to about 70 at %, or from about 45 to about 65 at %.

In some embodiments the films comprising $TiF_3$ comprise less than about 1 at % oxygen.

In some embodiments the film comprising $TiF_3$ that is deposited comprises $TiF_3$ particles embedded in a conductive or semiconducting transition metal compound phase. In some embodiments the $TiF_3$ particles have clear grain boundaries with the conductive or semiconducting transition metal compound phase. In some embodiments the $TiF_3$ particles comprise discrete particles surrounded by the conductive or semiconducting transition metal compound phase. In some embodiments the $TiF_3$ particles are less than about 500 nm in diameter, preferably less than about 100 nm in diameter, more preferably less than about 20 nm in diameter. In some embodiments the $TiF_3$ particles may be less than 10 nm in diameter. In some embodiments the average distance between the $TiF_3$ particles is less than about 50 nm, preferably less than about 20 nm. In some embodiments the average distance between the $TiF_3$ particles is from about 10 nm to about 20 nm. In some embodiments the $TiF_3$ particles comprise columnar grains. In some embodiments the columnar grains extend substantially throughout the thickness of the deposited thin film.

In some embodiments a film comprising $TiF_3$ is deposited on a substrate comprising silicon. In some embodiments a film comprising $TiF_3$ is deposited on a substrate comprising at least one of Si, SiGe Ge, CdTe, GaAs, GaSb, InGaAs or some other semiconducting material.

Figure 2:
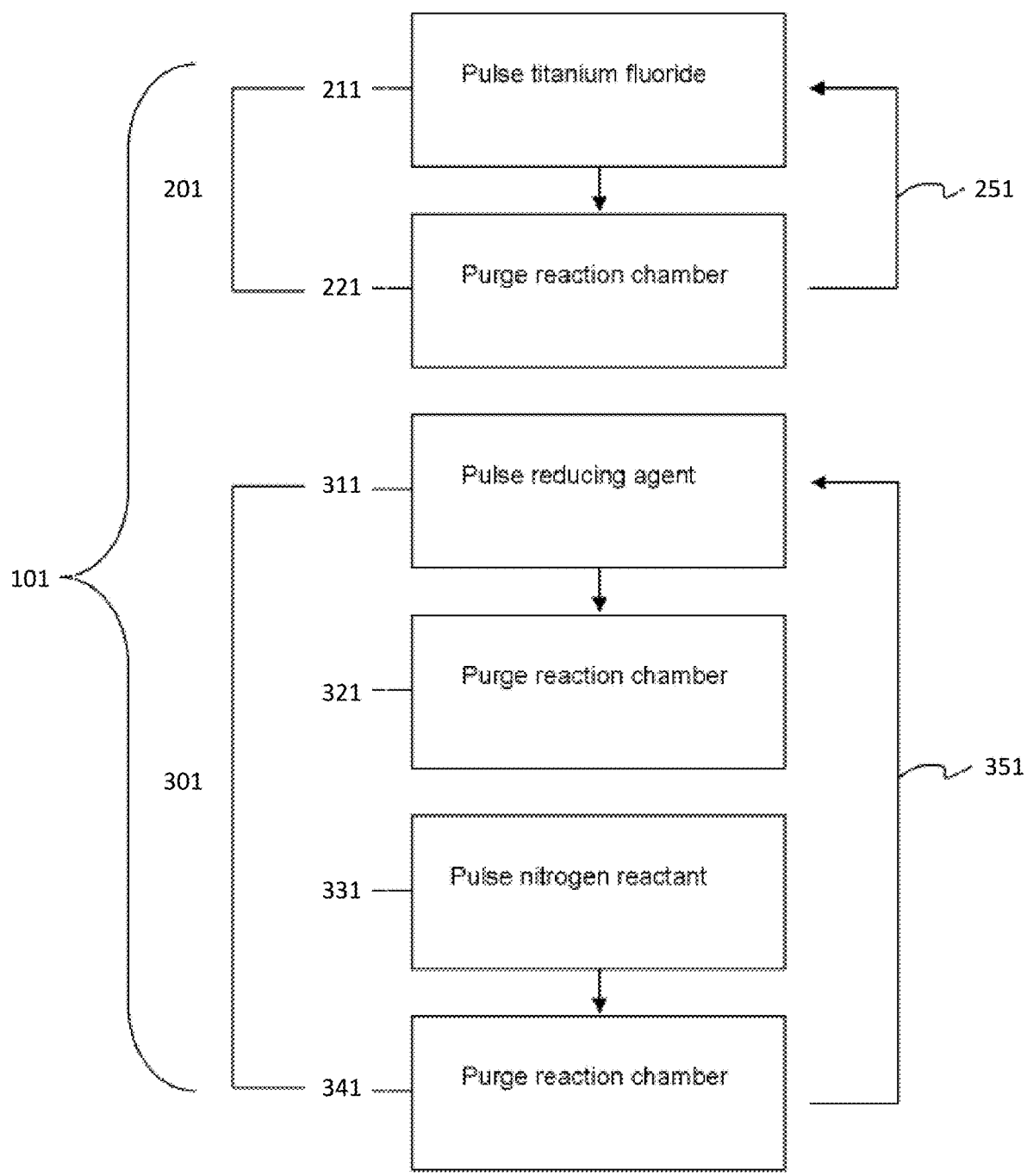
FIG. 2 is a flow chart illustrating an ALD process for depositing a $TiF_3$/TiN film according to one embodiment.
Figure 3:
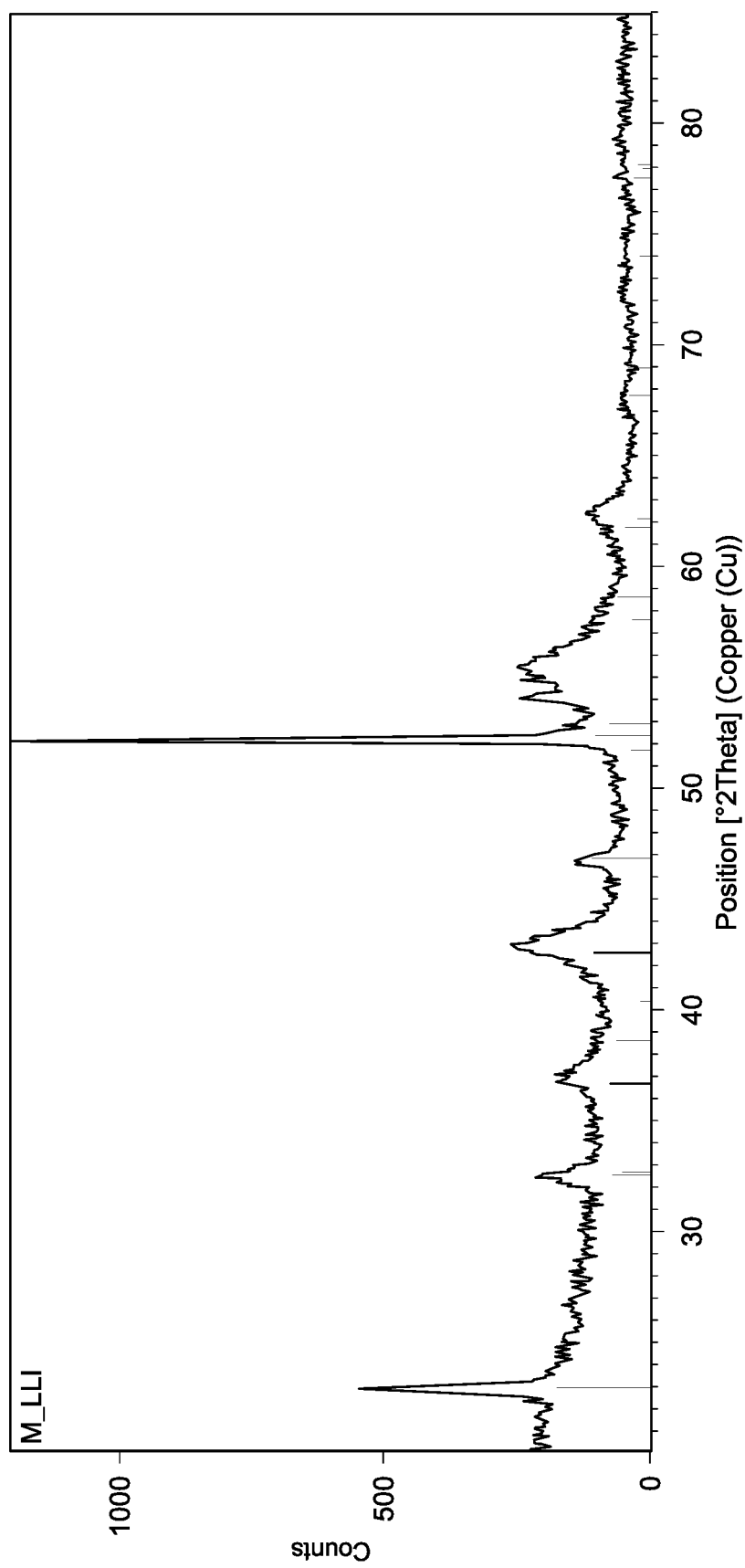
FIG. 3 shows the XRD pattern of a film formed according to one embodiment of the present disclosure.
Figure 4:
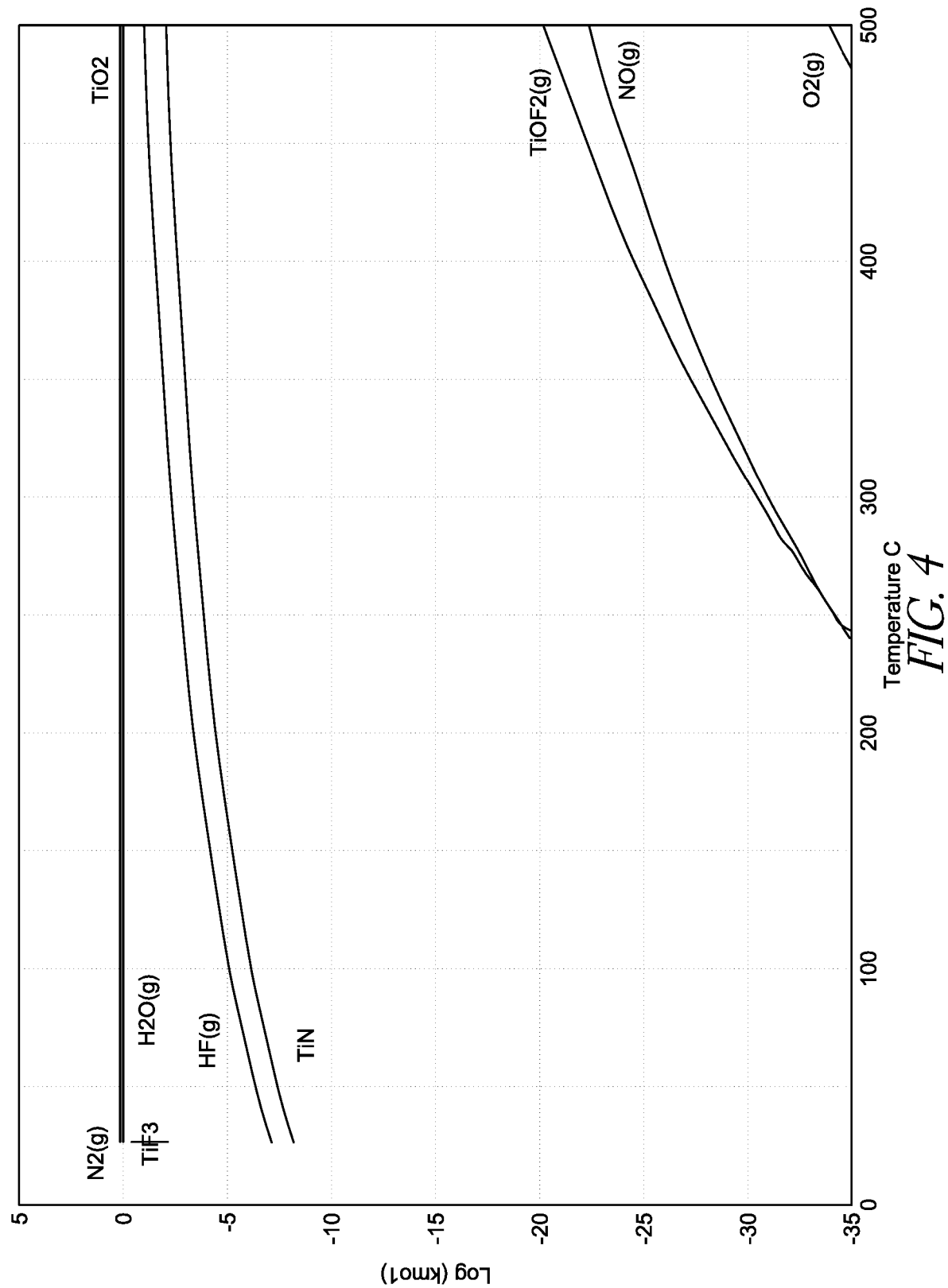
FIG. 4 is an analysis of the oxidation behavior of a film formed according to one embodiment of the present disclosure.
Figure 5:
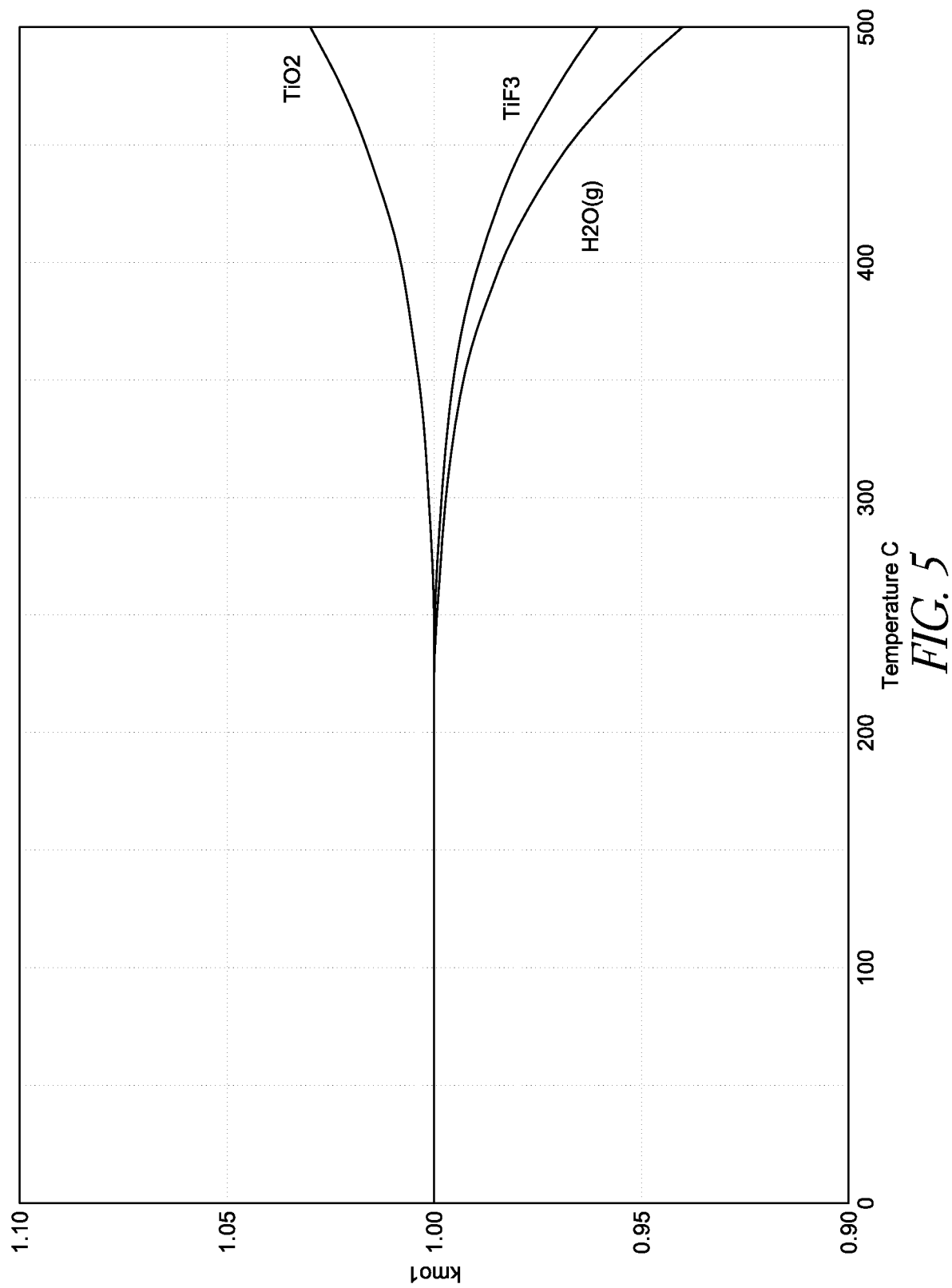
FIG. 5 is an additional analysis of the oxidation behavior of a film formed according to one embodiment of the present disclosure.

FIG. 2 illustrates an ALD process for forming a film comprising $TiF_3$ on a substrate in a reaction chamber comprising multiple ALD super-cycles 101. Each super-cycle comprises a first $TiF_4$ deposition sub-cycle 201 and a second reducing sub-cycle 301. The super-cycle 100 is repeated as many times as desired to deposit a $TiF_3$ film of the desired thickness. The ratio between sub-cycles 201 and 301 within the super-cycle 101 may be selected to achieve a film with the desired composition and properties.

The first titanium fluoride deposition sub-cycle comprises:
pulsing vaporized $TiF_x$, such as $TiF_4$, into the reaction chamber 211 to form at most a molecular monolayer of titanium fluoride on the substrate and
purging the reaction chamber 221 to remove excess titanium fluoride and reaction by products, if any, and repeating 251 the pulsing and purging steps.

In some embodiments, the first deposition sub-cycle is repeated 1, 2, 3, 4, 5, 10, 20, 50, 100, or more times in succession. In some embodiments the first deposition sub-cycle is repeated no more than about 30-60 times consecutively, up to about 30 to 50 times consecutively, or up to about 40 times consecutively.

The atomic layer deposition super-cycle 101 for forming the $TiF_3$/TiN film also comprises one or more second reducing sub-cycles 301. In some embodiments, the second reducing sub-cycle 301 comprises:
pulsing a vaporized reducing agent, such as disilane or trisilane, into the reaction chamber 311 to reduce at least some of the $TiF_4$ to $TiF_3$,
purging the reaction chamber 321 to remove excess reducing agent and reaction by products, if any,
providing a pulse of a nitrogen reactant, such as $NH_3$, into the reaction chamber 331, where the nitrogen reactant contributes at least some nitrogen to the titanium fluoride film,
purging the reaction chamber 341 to remove excess nitrogen reactant and any gaseous by-products, and
repeating 351 the pulsing and purging steps.

In some embodiments, the second reducing sub-cycle 301 is repeated 1, 2, 3, 4, 5, 10, 20, 50, 100 or more times in succession. In some embodiments the second reducing sub-cycle is repeated about 3 to 6 times, or about 5 times.

The first and second sub-cycles 201, 301 are repeated multiple times in a complete ALD super-cycle 101, and the complete ALD super-cycle 101 is repeated to form a $TiF_3$ film of a desired thickness comprising a desired concentration of titanium, fluorine, and nitrogen.

In some embodiments, the number of times the first deposition sub-cycle 201 and second reducing sub-cycle 301 are repeated is the same in each complete ALD super-cycle 100. In other embodiments, the number of first and second sub-cycles 101, 201 varies in one or more complete ALD super-cycles 101. The number of first and second sub-cycles 101, 201 in each complete ALD super-cycle 101 and the total number of first and second sub-cycles 101, 201 and total ALD super-cycles 101 can be adjusted to achieve deposition of a $TiF_3$/TiN film of a desired thickness and composition.

Although illustrated as beginning with the first deposition sub-cycle 201, each complete ALD cycle may begin and end with either the first 101 or second 201 sub-cycle. For example, each ALD super-cycle for forming the thin film can be started with the first titanium fluoride deposition sub-cycle or the reducing sub-cycle. In some embodiments one or more super-cycles may begin with the reducing sub-cycle.

In some embodiments the film comprising $TiF_3$ is deposited by ALD over a substrate surface to form a conformal thin film of 500 nm or less. In some embodiments the thickness of the film is less than 100 nm, less than about 50 or less than about 10 nm. Depending on the application the thickness could be much less, for example, from about 2 to about 50 Å, preferably from about 3 to about 30 Å and in some cases from about 5 to about 20 Å. In some embodiments, for example when a film comprising $TiF_3$ is used as a photoelectrode, the thickness of the film may be about 30 nm. In some embodiments the thin film may have a thickness of more than about 100 nm, more than about 1 am, or in some instances more than about 1 mm.

In some embodiments a film comprising $TiF_3$ is formed that only starts to oxidize in an oxygen or water/moisture-containing atmosphere, such as ambient air at temperatures above about 300° C.

Various modifications, omissions and additions may be made to the methods and structures described above without departing from the scope of the invention. All such modifications and changes are intended to fall within the scope of the invention, as defined by the appended claims.

Photonic Devices

The methods and materials described herein can provide films with photoactive or other desirable properties for use in photovoltaic or photonic devices, for example, solar cells or waveguide devices. According to some embodiments, composite thin films are deposited by disclosed methods on an appropriate substrate, for example a p-type silicon substrate, during photonic device fabrication.

In some embodiments a thin film or photonic device as described herein may operate or be active in at least the wavelengths of light that correspond to radiation from the sun. In some embodiments a thin film or photonic device operates or is active in at least wavelengths of light from about 100 nm to about 3000 nm. In some embodiments a thin film or photonic device operates or is active in at least wavelengths of visible light. In some embodiments a thin film or photonic device operates or is active in at least wavelengths greater than about 350 nm, or greater than about 500 nm. In some embodiments a thin film or photonic device operates or is active in at least wavelengths of light corresponding to red in the visible spectrum. In some embodiments a thin film or photonic device operates or is active in at least those wavelengths of radiation that a typical solar cell may operate in, as would be known to one of skill in the art, for example about 532 nm, and/or from about 630 m nm to about 680 nm, etc.

In some embodiments a photonic device may comprise a first conductive or semiconducting transition metal layer, a second semiconducting layer positioned above the first layer, and a third composite film layer positioned over the second layer. In some embodiments the layers are solid layers. In some embodiments the layers does not comprise liquid.

In some embodiments the first conductive or semiconducting transition metal layer can act as an electrical contact for the photonic device. In some embodiments the first layer may comprise a conductive or semiconducting transition metal oxide or nitride. In some embodiments the first layer may comprise a metal selected from Ti, Ta, Nb, Mo, and W. In some embodiments the first layer may comprise TiN. In some embodiments the first layer is solid. In some embodiments the first layer is not liquid. In some embodiments the thickness of the first layer is less than 500 nm. In some embodiments the thickness of the first layer is less than about 100 nm, preferably less than about 50 nm. In some embodiments the thickness of the first layer is 45 nm.

In some embodiments the second layer may comprise at least one of Si, SiGe Ge, CdTe, GaAs, GaSb, InGaAs or some other semiconducting material, such as III-V or II-VI materials. In some embodiments the second layer may comprise $p^+$-type silicon. In some embodiments the second layer may further comprise an oxide layer. In some embodiments the second layer may comprise an oxide layer, for example $SiO_2$, on a top surface, a bottom surface, or both a top and bottom surface. In some embodiments the oxide layer or layers may comprise a native oxide or a thermal oxide. In some embodiments the second layer is solid. In some embodiments the second layer is not liquid. In some embodiments the oxide layer or layers may be less than about 50 nm thick, preferably less than about 20 nm thick. In some embodiments the oxide layer or layers may be less than about 10 nm, less than about 5 nm, or less than about 3 nm thick. In some embodiments the second layer may not comprise an oxide on top surface, bottom surface, or both a top and bottom surface.

In some embodiments the third composite film layer may comprise a thin film as disclosed herein. In some embodiments the third composite film layer can comprise a dielectric transition metal compound phase embedded in a conductive or semiconducting transition metal compound phase. In some embodiments the dielectric transition metal compound phase may comprise discrete particles. In some embodiments the transition metal of the dielectric transition metal compound phase may be selected from one of Ti, Ta, Nb, Mo, and W. In some embodiments the dielectric transition metal compound phase may be selected from a list including: $TiF_3$, $Cr_2O_3$, NiO, $WO_3$, $Ti_2O_3$, $TiOF_2$, $NbO_2F$, $NbO_{3-x}F_x$, $NbO_{x/2}F_{3-x}$, $MoO_{3-x}F_x$, $MoO_xF_{3-x}$, $TaO_2F$, $TaO_xF_{3-x}$, $WO_{3-x}F_x$. In some embodiments the dielectric transition metal compound phase has an $ReO_3$ structure. In some embodiments the conductive or semiconducting transition metal compound phase may be selected from a list including: Cr, TiN, Fe, W, TiC, Ti. In some embodiments the dielectric transition metal compound phase comprises $TiF_3$. In some embodiments the conductive or semiconducting transition metal compound phase comprises TiN. In some embodiments the dielectric transition metal compound phase comprises $TiF_3$ and the conductive or semiconducting transition metal compound phase comprises TiN. In some embodiments the third layer comprises a mixture of $TiF_3$ and TiN.

In some embodiments the dielectric transition metal compound phase may comprise particles from about 0.1 nm to about 500 nm. In some embodiments the dielectric transition metal compound phase particles have clear grain boundaries with the conductive or semiconducting transition metal compound phase. In some embodiments the dielectric transition metal compound phase particles are less than about 500 nm in diameter, preferably less than about 100 nm in diameter, more preferably less than about 20 nm in diameter. In some embodiments the dielectric transition metal compound phase particles may be less than 10 nm in diameter. In some embodiments the average distance between the dielectric transition metal compound phase particles is less than about 50 nm, preferably less than about 20 nm. In some embodiments the average distance between the dielectric transition metal compound phase particles is from about 10 nm to about 20 nm. In some embodiments the dielectric transition metal compound phase particles comprise columnar grains. In some embodiments the columnar grains extend substantially throughout the thickness of the third layer.

In some embodiments the second layer may act as a photoactive component in a photonic device. In some embodiments the third layer may act as a photoactive component in a photonic device. In some embodiments the second layer and third layer may act as a photoactive component in a photonic device. In some embodiments the photoactive component absorbs radiant energy of photons to produce electrical energy in a circuit, for example the photoactive component may produce an electrical potential difference within the device when exposed to incident light. In some embodiments the photoactive component is configured to utilize electrical energy to produce photons.

In some embodiments the third layer of the photonic device comprises a photon transparent component configured to allow a photon to pass through the photon transparent component. In some embodiments the third layer of the photonic device comprises a charge collecting component configured to collect photon excited charge carriers. In some embodiments the third layer of the photonic device comprises a waveguide component configured to transfer characteristics of a photon flux incident on at least a portion of the photonic device.

According to some embodiments, there is disclosed herein a photonic device comprising a dielectric transition metal compound phase embedded in a conductive or semiconducting transition metal compound phase. In some embodiments the dielectric transition metal compound phase may comprise discrete particles. In some embodiments the dielectric transition metal compound phase may comprise particles from about 0.1 nm to about 500 nm. In some embodiments the conductive or semiconducting transition metal compound phase surrounds the dielectric transition metal compound phase particles.

In some embodiments the photonic device comprises a photoactive component. In some embodiments the photoactive component is configured to absorb radiant energy of photons to produce electrical energy in a circuit. In some embodiments the photoactive component is configured to utilize electrical energy to produce photons. In some embodiments the photoactive component comprises a dielectric transition metal compound phase embedded in a conductive or semiconducting transition metal compound phase. In some embodiments the photoactive component comprises a semiconducting material. In some embodiments the photoactive component comprises Si, SiGe, Ge, CdTe, GaAs, GaSb, and/or InGaAs. In some embodiments the photoactive component comprises a mixture of $TiF_3$ and TiN.

In some embodiments the photonic device comprises a photon transparent component configured to allow a photon to pass through the photon transparent component. In some embodiments the photon transparent component comprises a dielectric transition metal compound phase embedded in a conductive or semiconducting transition metal compound phase. In some embodiments the photon transparent component comprises a mixture of $TiF_3$ and TiN.

In some embodiments the photonic device comprises a charge collecting component configured to collect photon excited charge carriers. In some embodiments the charge collecting component comprises a dielectric transition metal compound phase embedded in a conductive or semiconducting transition metal compound phase. In some embodiments the charge collecting component comprises indium tin oxide, doped tin oxide, zinc oxide, doped zinc oxide, conductive polymer, a metal grid, carbon nanotubes, graphene, or a nanowire thin film. In some embodiments the charge collecting component comprises a mixture of $TiF_3$ and TiN.

In some embodiments the photonic device comprises a waveguide component configured to transfer characteristics of a photon flux incident on at least a portion of the photonic device. In some embodiments the waveguide component comprises a dielectric transition metal compound phase embedded in a conductive or semiconducting transition metal compound phase.

EXAMPLES

A number of $TiF_3$ films were deposited by ALD in a Pulsar® 2000 R&D reactor. The films were deposited with a super-cycle method using the following basic super-cycle, comprising a $TiF_4$ sub-cycle and a reducing sub-cycle: $z[x(TiF_4+y(Si_3H_8+NH_3)]$ and $z[x(TiF_4+y(Si_2H_6+NH_3)]$. The reactor temperature was about 370° C.

The basic process parameters were: $TiF_4$; 3 second pulse/5 second purge, $NH_3$; 10 second pulse/5 second purge, $Si_2H_6/Si_3H_8$; 1 second pulse/5 second purge.

The films were deposited on silicon with native oxide. Film compositions were altered by changing the $TiF_4$/reducing sub-cycle ratio (x/y) and film thicknesses were controlled by the number of super-cycles (z).

The films were characterized by four point probe measurements with CDE Resmap 168 for sheet resistance, x-ray reflectivity (XRR) with Brüker D8 Advance for thickness, roughness and density, by Sentech SE800 ellipsometer for thickness, by x-ray photoelectron spectroscopy (XPS) with PHI Quantum 2000 using monochromated $AlK_\alpha$ for composition (analysis done by EAG labs, East Windsor, N.J.), x-ray diffraction (XRD) with PANalytical X'Pert Pro MPD X-ray diffractometer with $CuK_\alpha$ radiation The ALD processes resulted in films that contained a surprising amount of fluorine. XPS and XRD analysis revealed the films to be a mixture of $TiF_3$ and TiN. The films were transparent and electrically conductive. Table 1 summarizes the composition, resistivity, roughness, density and growth rates of the processes with different $TiF_4$/reducing sub-cycle ratios.

TABLE 1

Rs and ellipsometry data of $TiF_4$ + $Si_2H_6/Si_3H_8$ + $NH_3$ with different pulsing ratios.

| | Sample | | | | | |
|---|---|---|---|---|---|---|
| | 1 | 2 | 3 | 4 | 5 | 6 |
| Reducing Agent | $Si_3H_8$ | $Si_3H_8$ | $Si_3H_8$ | $Si_2H_6$ | $Si_2H_6$ | $Si_2H_6$ |
| $TiF_4$/reducing sub-cycle ratio | 0.1 | 0.2 | 1 | 0.1 | 0.2 | 1 |
| $TiF_4$/($TiF_4$ + reducing) sub-cycle ratio | 0.09 | 0.17 | 0.50 | 0.09 | 0.17 | 0.50 |
| Sub-cycles | 440 | 360 | 400 | 440 | 360 | 400 |
| Super-cycles | 400 | 300 | 200 | 400 | 300 | 200 |
| Rs, Ω/sq (center point) | — | — | 141000 | 20200 | 217000 | 263 |
| Layer Resistivity, μΩcm (center point) | — | — | 696540 | 88314 | 911400 | 822 |
| Layer thickness, nm (3 mm EE, 21 points, average, ellipsometer) | 60.1 | 60.3 | 49.4 | 43.7 | 42.0 | 31.3 |

TABLE 1-continued

Rs and ellipsometry data of TiF$_4$ + Si$_2$H$_6$/Si$_3$H$_8$ + NH$_3$ with different pulsing ratios.

| | Sample | | | | | |
|---|---|---|---|---|---|---|
| | 1 | 2 | 3 | 4 | 5 | 6 |
| Layer Th Uf (3 mm EE, 21 points, ellipsometer) | 10.6% | 6.9% | 17.2% | 13.6% | 14.4% | 13.9% |
| Layer RI (average, 21 points, ellipsometer) | 1.66 | 1.63 | 1.75 | 1.83 | 1.83 | 2.02 |
| N, at.-% | 8.6 | 8 | 5.5 | 12.7 | 9.9 | 40.3 |
| O, at.-% | 0.6 | 0.9 | 0.6 | 0.9 | 0.6 | 2.1 |
| F, at.-% | 59.3 | 60.6 | 65 | 55 | 58.6 | 15.7 |
| Si, at.-% | 2.3 | 1.6 | 0.4 | 1.6 | 1 | — |
| Ti, at.-% | 28.9 | 28.7 | 28.2 | 29.6 | 29.8 | 41.4 |

A number of composite films comprising TiF$_3$ particles embedded in TiN (TiF$_3$:TiN films) were deposited by ALD processes as disclosed herein. The films comprised TiF$_3$ phase particles embedded in TiN. The films were deposited with a super-cycle method using the following basic super-cycle, comprising: a TiF$_4$ sub-cycle with a reducing sub-cycle: z[x(TiF$_4$+y(Si$_2$H$_6$+NH$_3$)] and z[x(TiF$_4$+y(Si$_3$H$_8$+NH$_3$)]. The reactor temperature was 370° C.

The basic process parameters were: TiF$_4$; 3 second pulse/5 second purge, NH$_3$; 10 second pulse/5 second purge, Si$_2$H$_6$/Si$_3$H$_8$; 1 second pulse/5 second purge.

The films were deposited on a silicon substrate with native oxide. The film compositions and the sizes of the TiF$_3$ phase particles in each film were altered by changing the TiF$_4$/reducing sub-cycle ratio (x/y) and film thicknesses were controlled by the number of super-cycles (z). Thin films with TiF$_3$ phase particles ranging from 2 nm to 50 nm were deposited.

Figure 6:
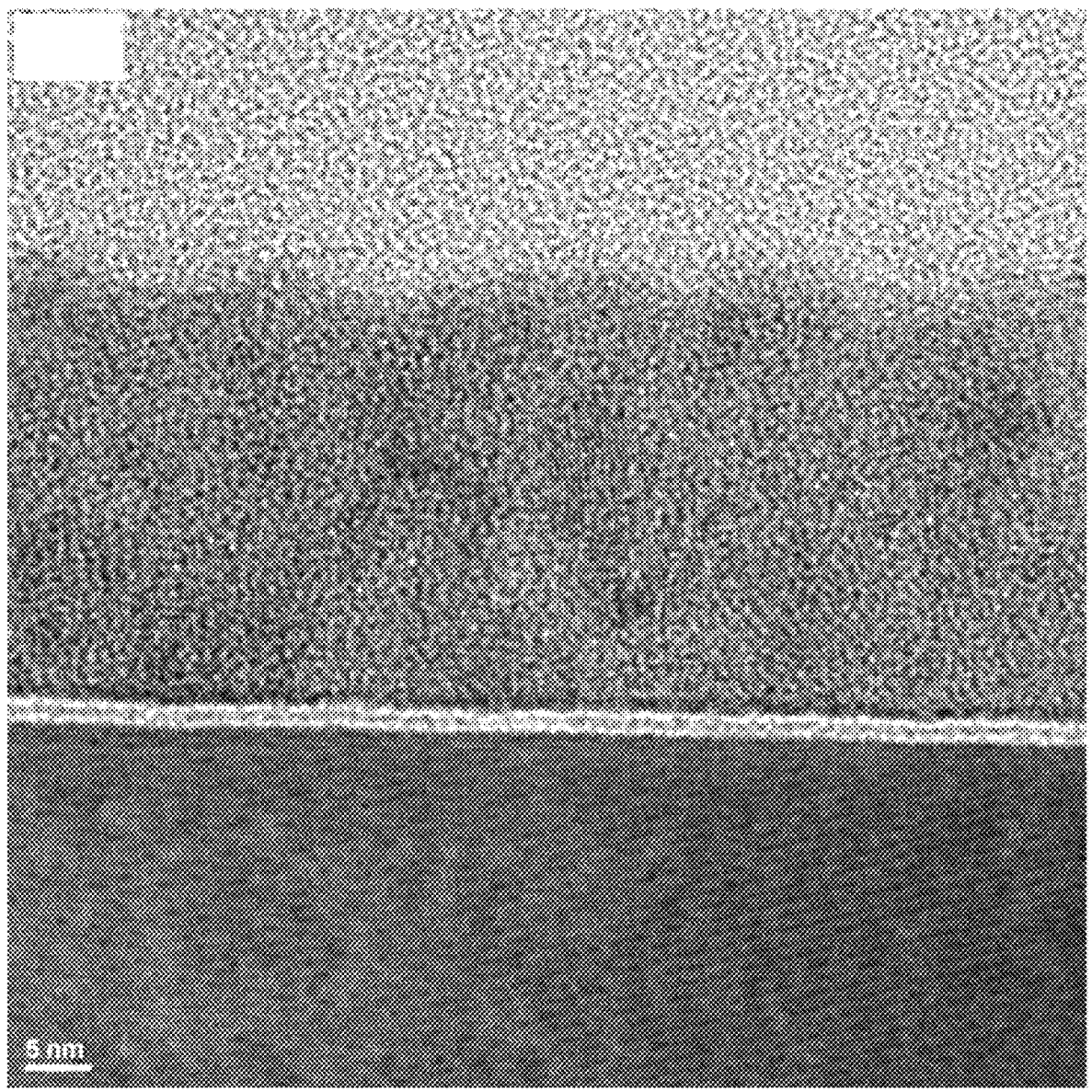
FIG. 6 shows a dark field TEM image and a cross-sectional TEM image of a TiN film comprising $TiF_3$ particles embedded therein and deposited using $TiF_4$, $Si_2H_6$ as a reducing agent, and $NH_3$ as a nitrogen reactant.
Figure 7A:
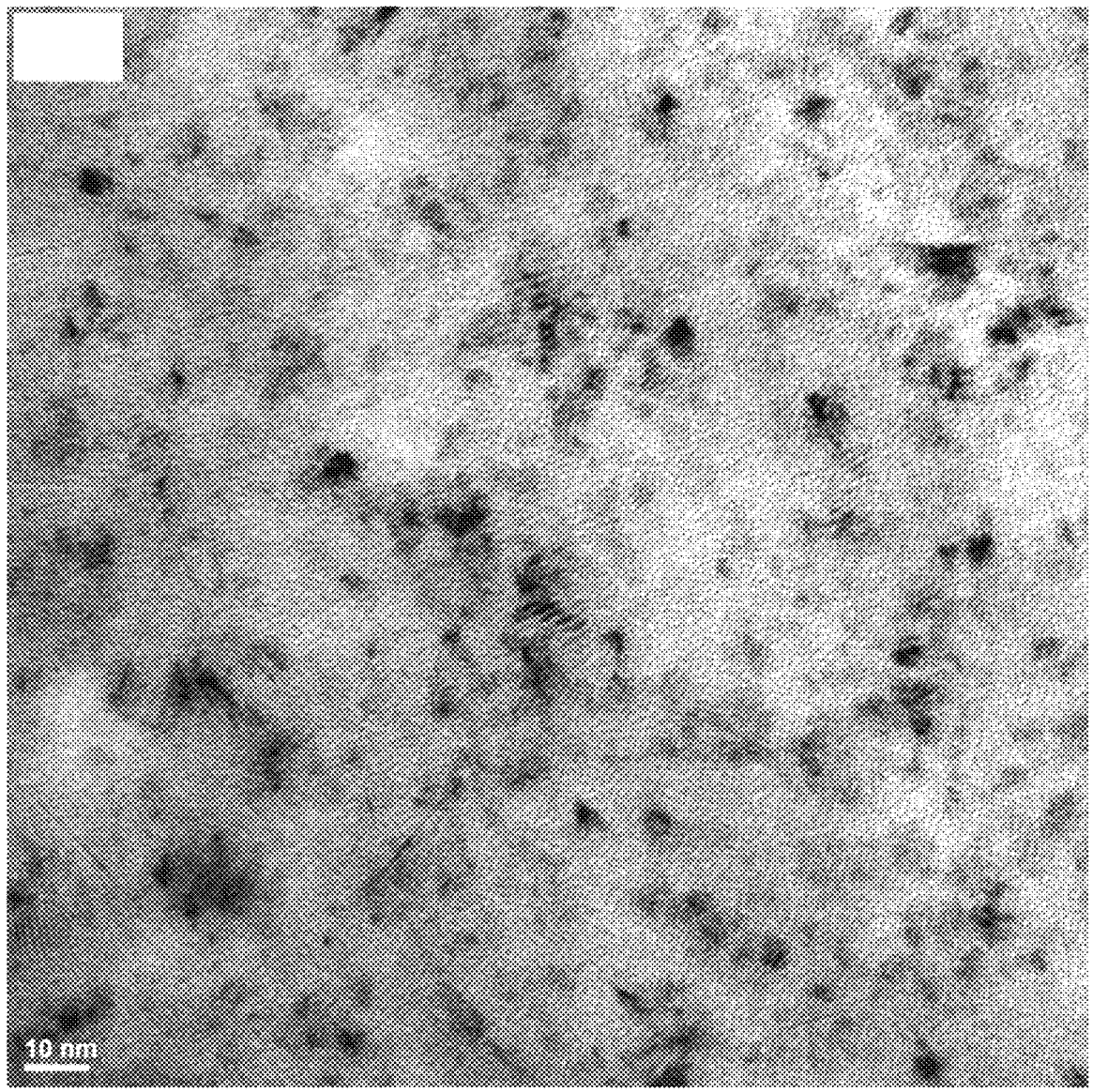
FIGS. 7A and 7B show bright field and dark field TEM images of a TiN film comprising $TiF_3$ particles embedded therein.
Figure 7B:
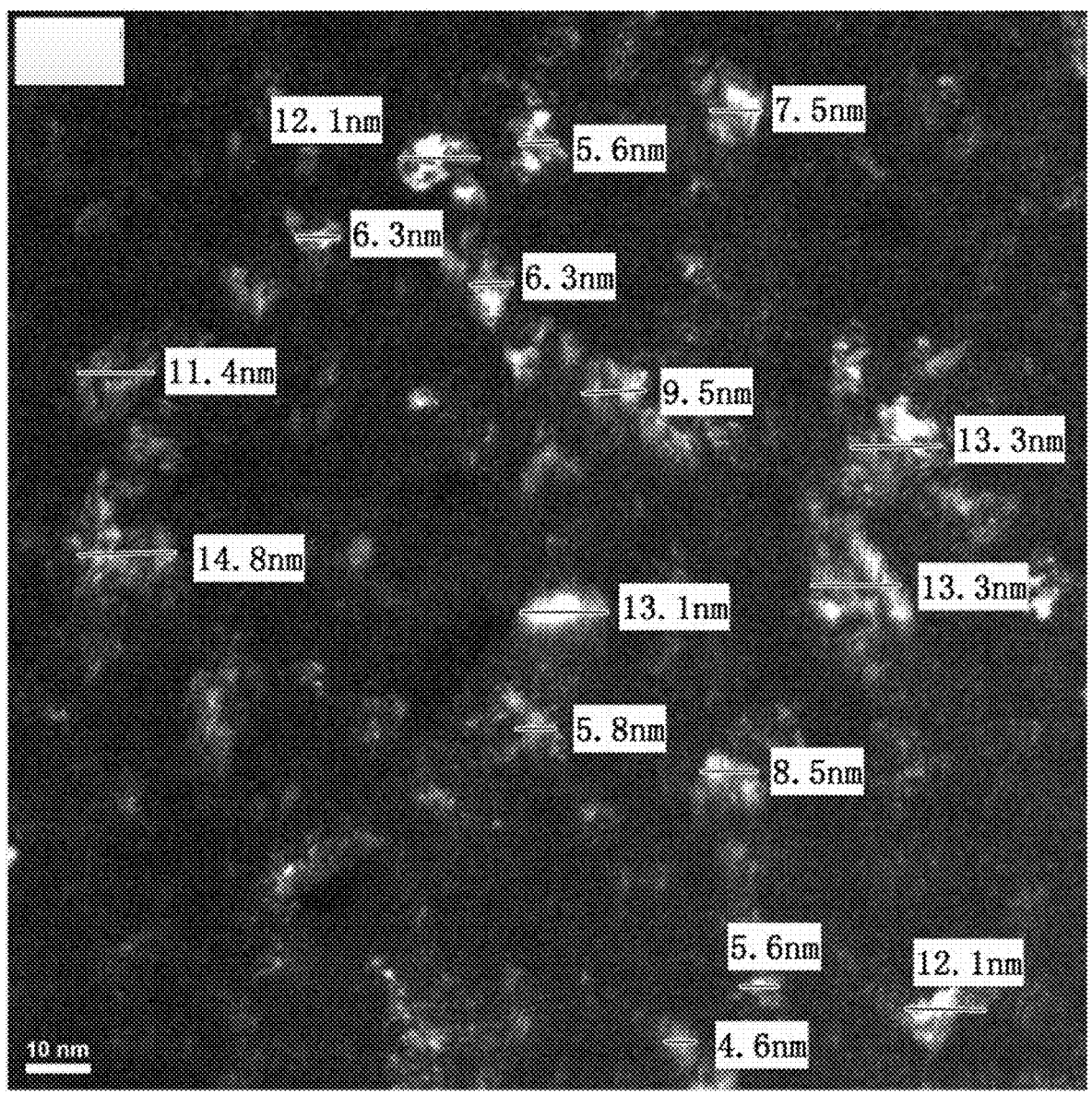

The thin film's structure was characterized using both bright field and dark field electron microscopy. FIG. 6 is a bright field cross sectional TEM image showing the structure of the deposited TiF$_3$:TiN film on a silicon substrate. FIGS. 7A and 7B show bright field and dark field TEM images, respectively, of a TiN film comprising TiF$_3$ particles embedded therein. The film was deposited with a super-cycle method using the following basic super-cycle, comprising: a TiF$_4$ sub-cycle with a reducing sub-cycle: z[x(TiF$_4$+y(Si$_2$H$_6$+NH$_3$)]. TiF$_3$ particles embedded in and surrounded by TiN are visible as dark spots in the bright field TEM image of FIG. 7A. The TIF$_3$ particles embedded in and surrounded by TiN are visible as white spots in the dark field TEM image of FIG. 7B. The TiF$_3$ particles in the present sample ranged in size from 4.6 nm to 14.8 nm. The sheet resistance of the film was characterized by four point probe measurements and was found to be 263 Ω/sq.

Figure 8:
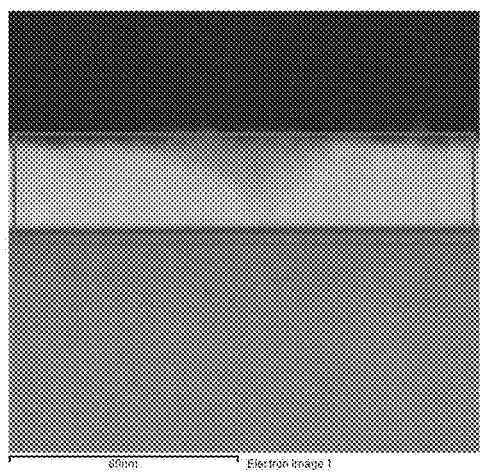
FIG. 8 shows energy-dispersive X-ray spectroscopy (EDS) images of elemental distributions in a sample TiN film comprising $TiF_3$ particles embedded therein and deposited using $TiF_4$, $Si_2H_6$ as a reducing agent, and $NH_3$ as a nitrogen reactant.
Figure 8:
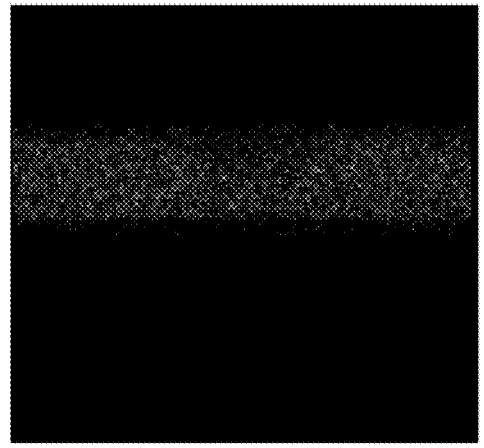
Figure 8:
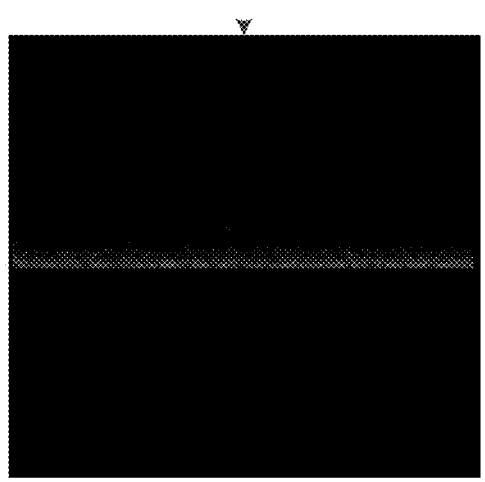
Figure 8:
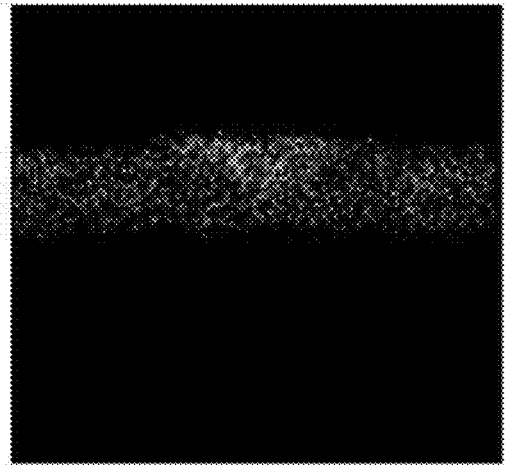
Figure 8:
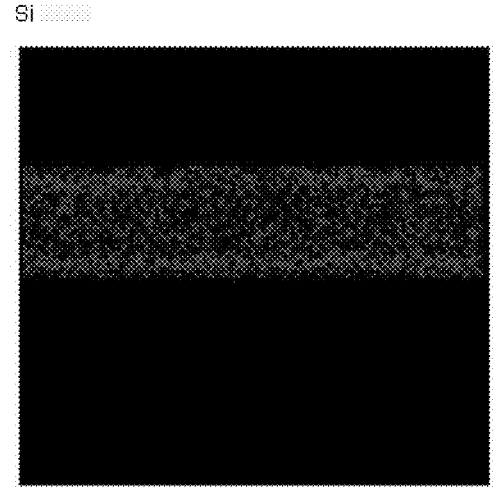
Figure 8:
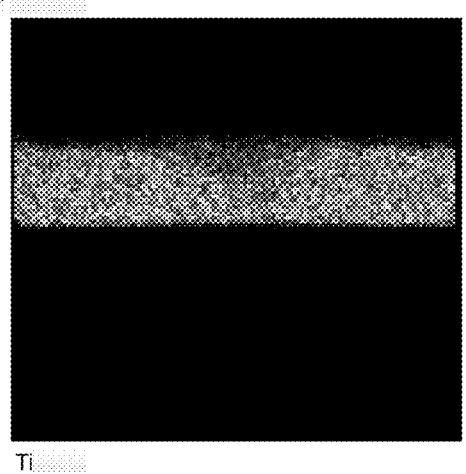

The composition of the thin film was characterized using energy-dispersive X-ray spectroscopy (EDS) performed using a transmission electron microscope (TEM). FIG. 8 shows TEM/EDS cross-sectional images of elemental distributions in a sample TiN film comprising TiF$_3$ particles embedded therein and deposited using TiF$_4$, Si$_2$H$_6$ as a reducing agent, and NH$_3$ as a nitrogen reactant. These images confirm the presence of relatively discrete TiF$_3$ crystals embedded in a TiN matrix.

Figure 9:
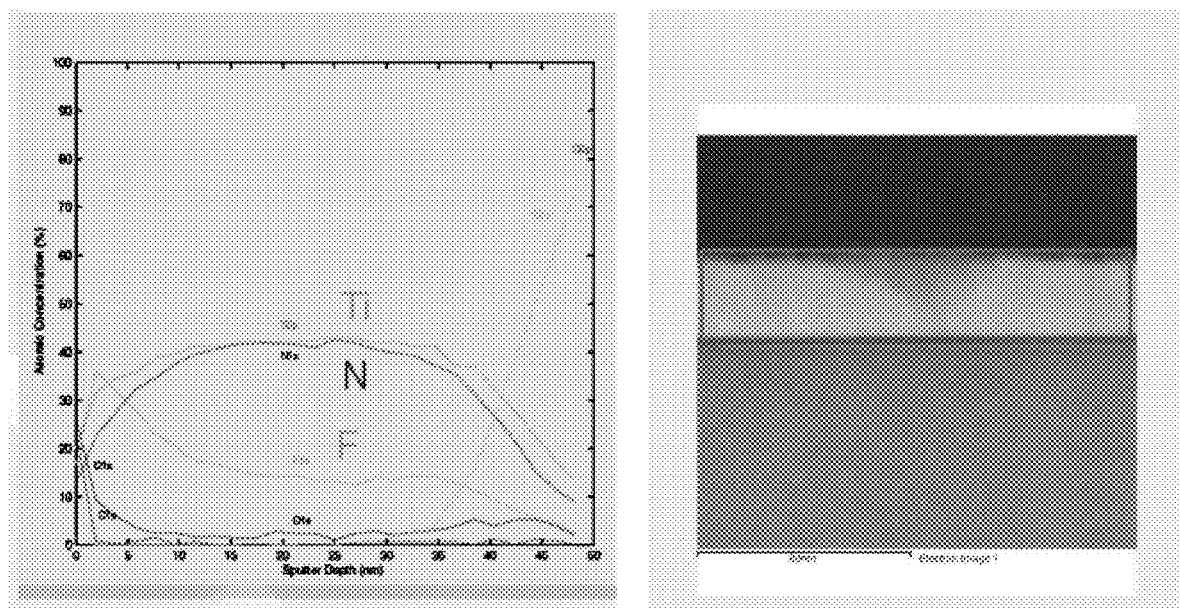
FIG. 9 shows an XPS depth profile for a sample TiN film comprising $TiF_3$ particles embedded therein and deposited using $TiF_4$, $Si_2H_6$ as a reducing agent, and $NH_3$ as a nitrogen reactant.

XPS analysis was carried out on a sample film and showed that the TiF$_3$:TiN thin film had higher fluorine content near the surface of the film. FIG. 9 shows an XPS depth profile for a sample TiN film comprising TiF$_3$ particles embedded therein and deposited using TiF$_4$, Si$_2$H$_6$ as a reducing agent, and NH$_3$ as a nitrogen reactant.

Figure 10A:
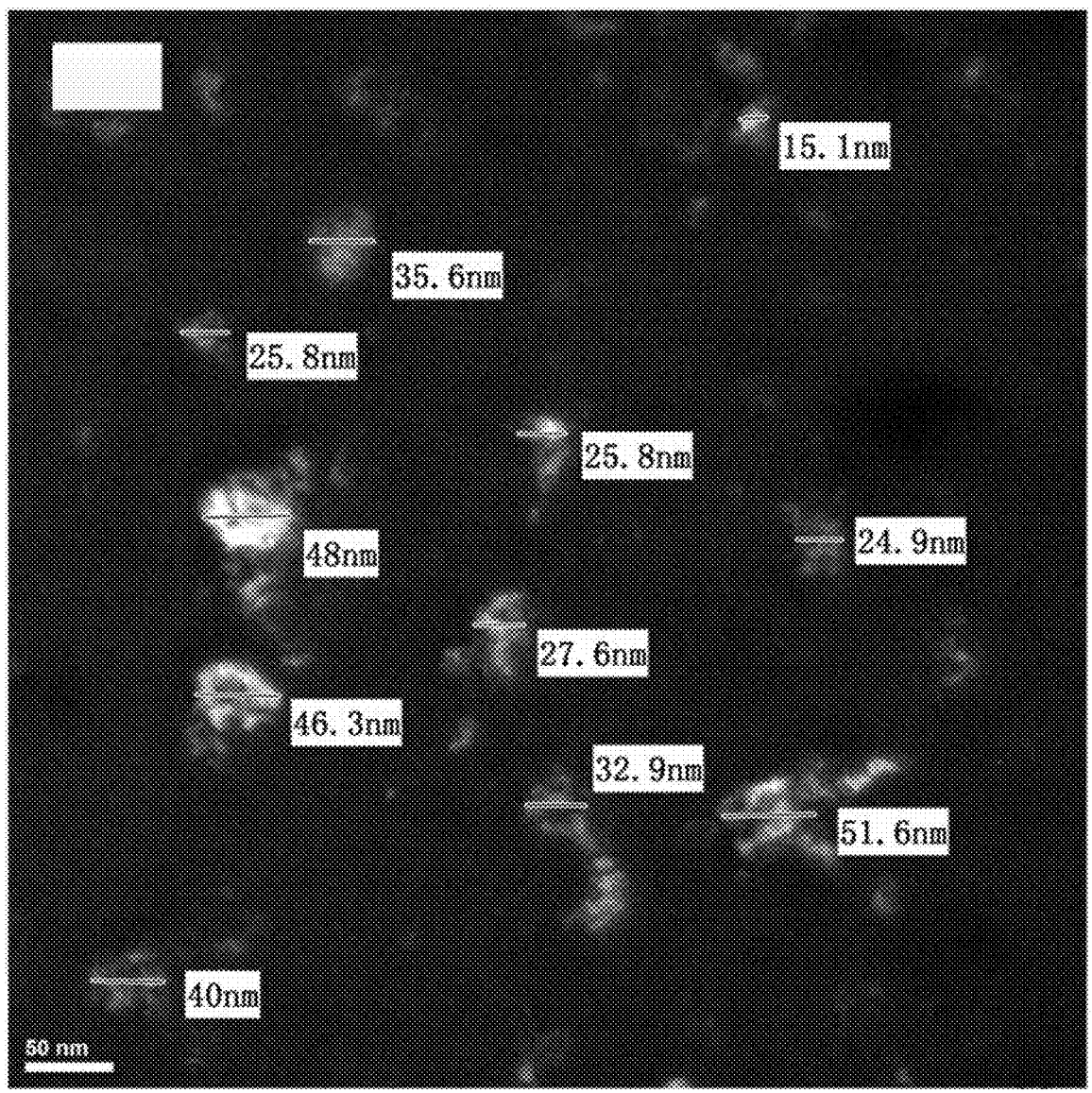
FIGS. 10A and 10B show a dark field TEM image and a cross-sectional TEM image of a TiN film comprising $TiF_3$ particles embedded therein and deposited using $TiF_4$, $Si_3H_8$ as a reducing agent, and $NH_3$ as a nitrogen reactant.
Figure 10B:
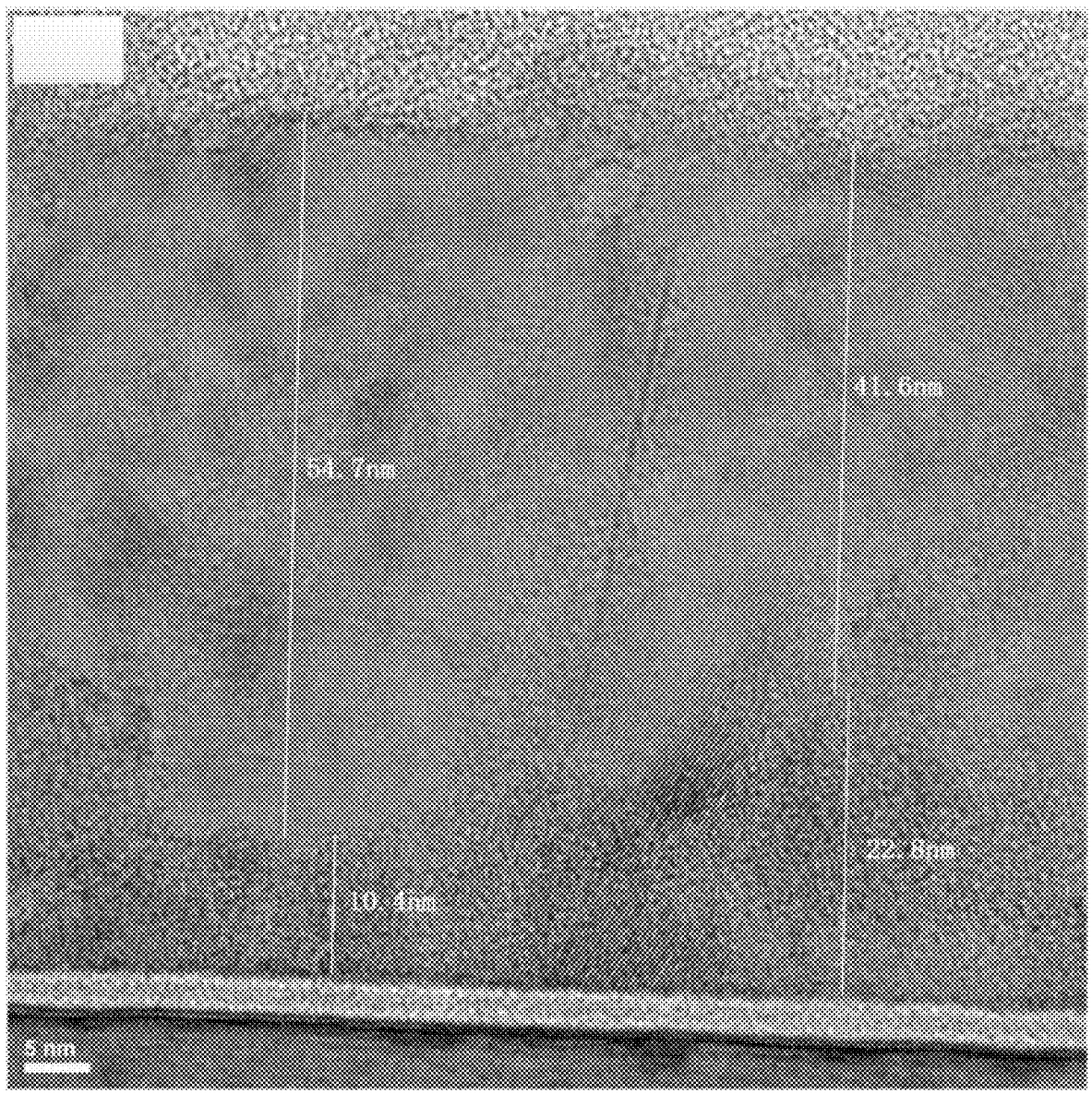

A thin film was also deposited with a super-cycle method using the following basic super-cycle, comprising: a TiF$_4$ sub-cycle with a reducing sub-cycle: z[x(TiF$_4$+y(Si$_2$H$_8$+NH$_3$)]. The thin film's structure was characterized using both bright field and dark field electron microscopy. FIG. 10A is a dark field TEM image of the TiN film comprising TiF$_3$ particles embedded therein. The TIF$_3$ particles embedded in and surrounded by TiN are visible as white spots and range in size from 15.1 nm to 48 nm. FIG. 10B shows a cross-sectional bright field image of the sample film. The image shows the dimensions of an induvial TiF$_3$ particle of the sample film. The sheet resistance of the film was also characterized by four point probe measurements and was found to be 141 kΩ/sq.

Figure 11:
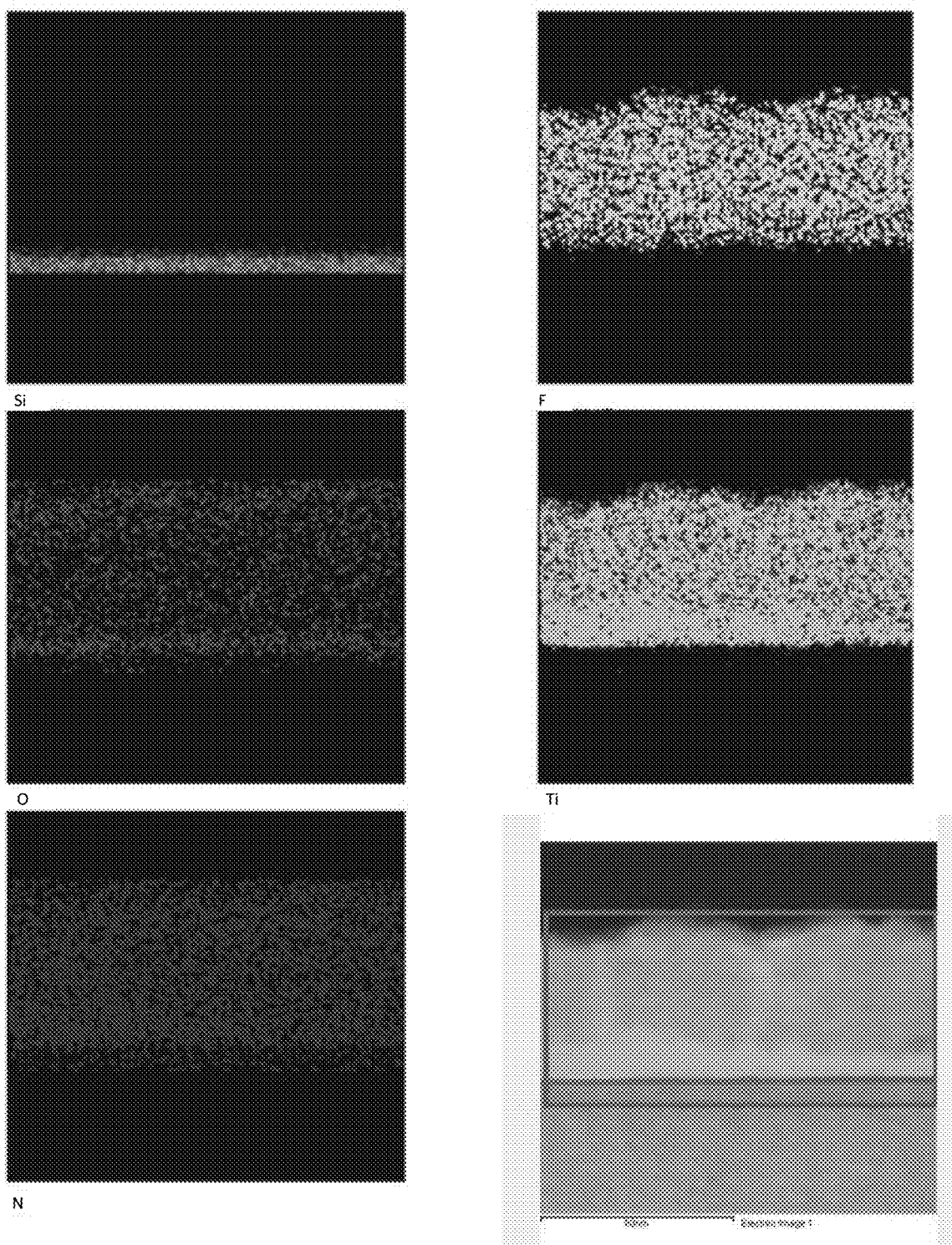
FIG. 11 shows EDS images of elemental distributions in a sample TiN film comprising $TiF_3$ particles embedded therein and deposited using $TiF_4$, $Si_3H_8$ as a reducing agent, and $NH_3$ as a nitrogen reactant.

The composition of the thin film was characterized using energy-dispersive X-ray spectroscopy (EDS) performed using a transmission electron microscope (TEM). FIG. 11 shows TEM/EDS cross-sectional images of elemental distributions in a sample TiN film comprising TiF$_3$ particles embedded therein and deposited using TiF$_4$, Si$_2$H$_8$ as a reducing agent, and NH$_3$ as a nitrogen reactant. These images confirm the presence of relatively discrete TiF$_3$ crystals embedded in a TiN matrix.

Figure 12:
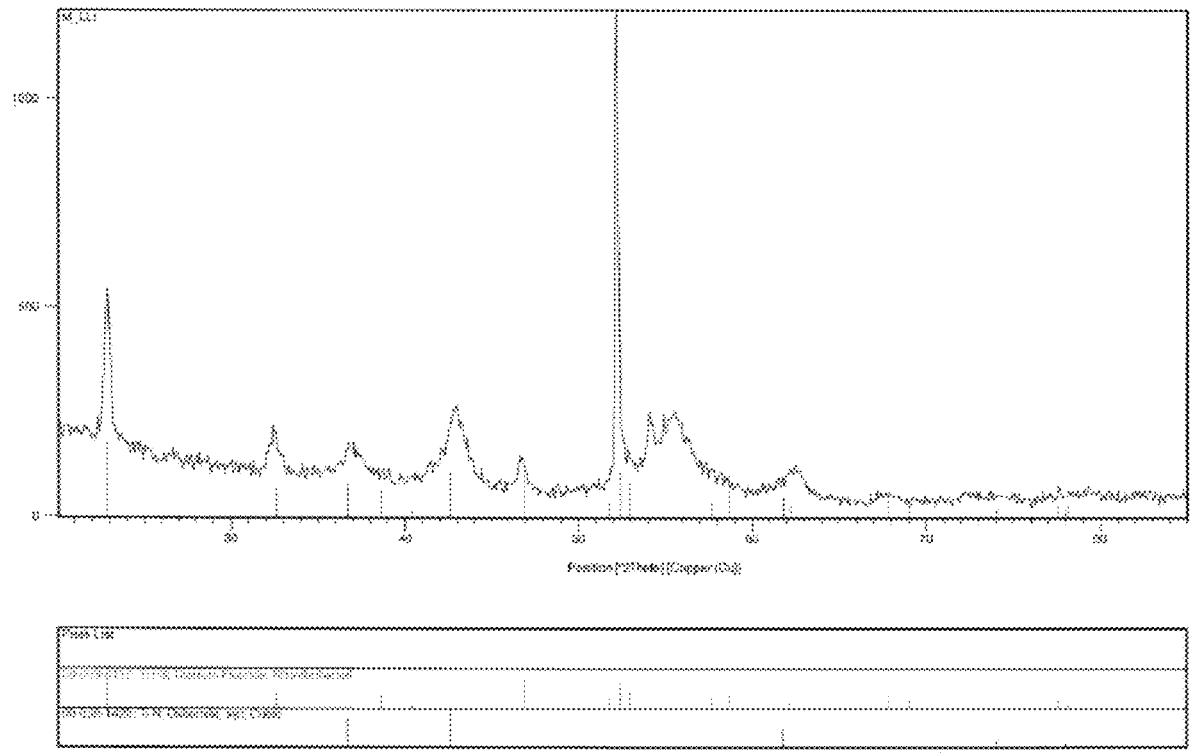
FIG. 12 shows an XRD pattern for a sample TiN film comprising $TiF_3$ particles embedded therein and deposited using $TiF_4$, $Si_3H_8$ as a reducing agent, and $NH_3$ as a nitrogen reactant.

XRD analysis was carried out on the sample film and confirmed the presence of separate TiF$_3$ and TiN crystallographic phases in the film. FIG. 12 shows an XRD pattern for a sample TiN film comprising TiF$_3$ particles embedded therein and deposited using TiF$_4$, Si$_3$H$_8$ as a reducing agent, and NH$_3$ as a nitrogen reactant.

Figure 13:
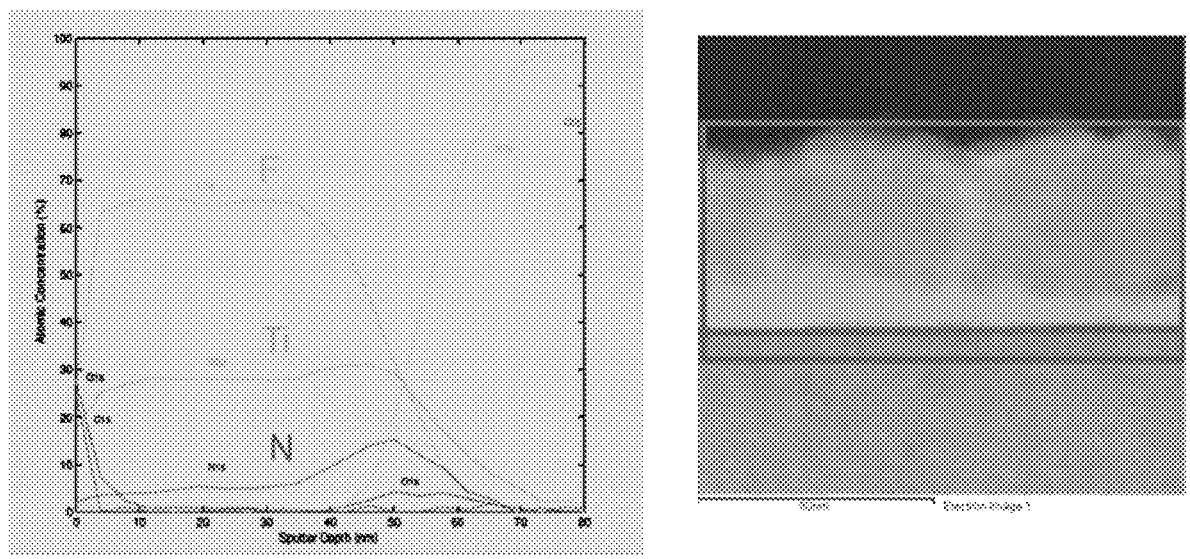
FIG. 13 shows an XPS depth profile for a sample TiN film comprising $TiF_3$ particles embedded therein and deposited using $TiF_4$, $Si_3H_8$ as a reducing agent, and $NH_3$ as a nitrogen reactant.

XPS analysis was carried out on the sample film and showed that the TiF$_3$:TiN thin film had higher nitrogen content near the silicon substrate interface. FIG. 13 shows an XPS depth profile for a sample TiN film comprising TiF$_3$ particles embedded therein and deposited using TiF$_4$, Si$_3$H$_8$ as a reducing agent, and NH$_3$ as a nitrogen reactant.

Figure 14A:
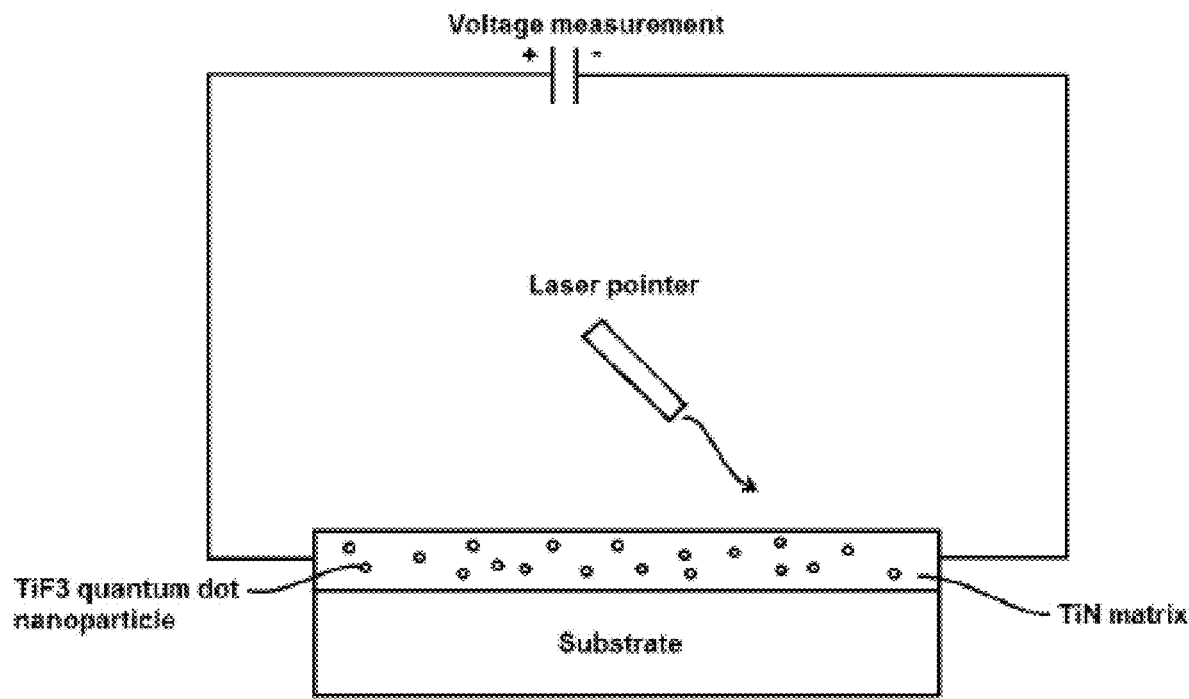
FIGS. 14A and 14B show schematic diagrams of the photovoltaic analysis of sample TiN films comprising $TiF_3$ particles embedded therein and deposited using $TiF_4$, $Si_2H_6$/$Si_3H_8$ as a reducing agent, and $NH_3$ as a nitrogen reactant.
Figure 14B:
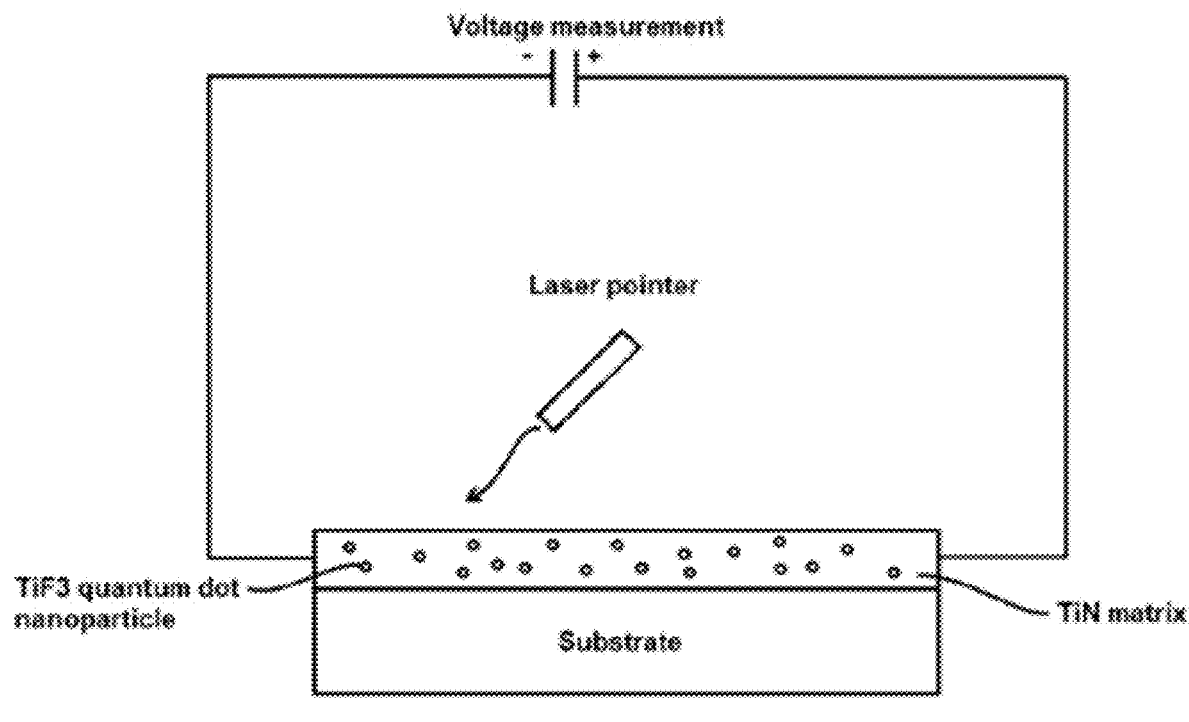

30 nm thick sample TiF$_3$:TiN films were deposited on silicon wafers with a super-cycle method using the following basic super-cycle, comprising: a TiF$_4$ sub-cycle with a reducing sub-cycle: z[x(TiF$_4$+y(Si$_2$H$_6$+NH$_3$)] and z[x(TiF$_4$+y(Si$_3$H$_8$+NH$_3$)]. The reactor temperature was 370° C. The photoactivity of the films was analyzed by contacting the film surface with Fluke 189 voltmeter electrodes placed several centimeters apart. A red laser pointer was then aimed at the surface of the film to thereby produce an illumination spot. FIGS. 14A and 14B show a schematic diagram of this photovoltage analysis. It was found that the electrode that was closer to the laser pointer illumination spot obtained a negative charge. The potential difference between the electrodes varied from few millivolts to about 100 millivolts, depending on the position of the illumination spot. FIGS.

14A-B show the change in polarity of the voltmeter electrodes as the location of the illumination spot on the film is changed.

Figure 15A:
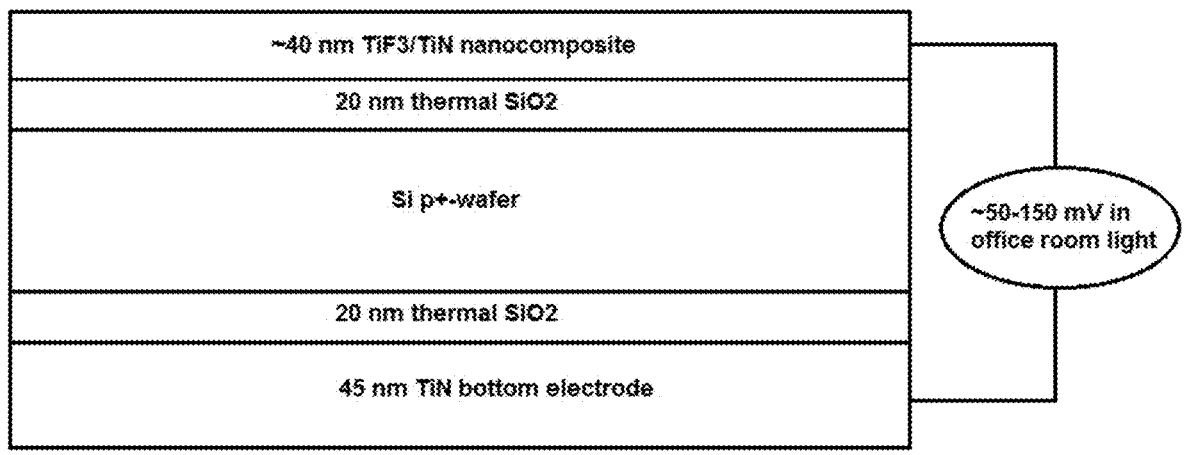
FIGS. 15A and 15B show schematic diagrams of photovoltaic cells having a top electrode comprising a TiN film comprising $TiF_3$ particles embedded therein and deposited using $TiF_4$, $Si_2H_6$/$Si_3H_8$ as a reducing agent, and $NH_3$ as a nitrogen reactant.

Sample photovoltaic cells were prepared using $TiF_3$:TiN thin films deposited with a super-cycle method using the following basic super-cycle, comprising: a $TiF_4$ sub-cycle with a reducing sub-cycle: $z[x(TiF_4+y(Si_2H_6+NH_3)]$ and $z[x(TiF_4+y(Si_3H_8+NH_3)]$. FIG. 15A shows a schematic diagram of a photovoltaic cell comprising $p^+$-type silicon having 20 nm thick thermal oxide upper and lower layers situated between a 45 nm thick TiN bottom electrode, and a 40 nm thick $TiF_3$:TiN top electrode. The cell had a surface area of approximately 4 cm². The cell was exposed to normal office room lighting, which resulted in an open circuit voltage of 50 mV-150 mV. When exposed to normal office room lighting the cell produced about 2.5 µA into a 120Ω resistor.

Figure 15B:
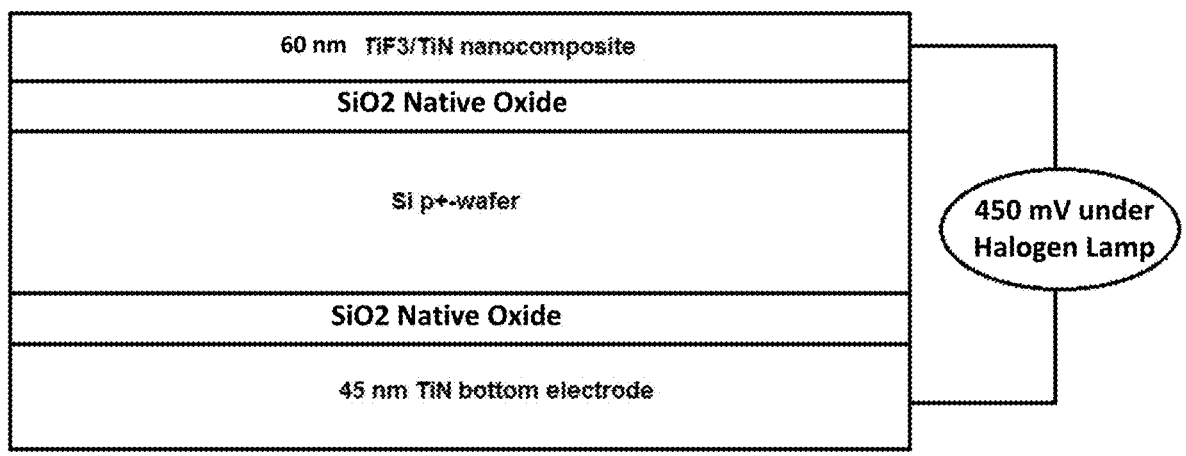

FIG. 15B shows a schematic diagram of a photovoltaic cell comprising $p^+$-type silicon having native oxide upper and lower layers situated between a 45 nm thick TiN bottom electrode, and a 60 nm thick $TiF_3$:TiN top electrode. Again, the cell had a surface area of approximately 4 cm². The cell was illuminated by a halogen lamp (Osram 50 W, 240 V bulb, 2800K) which resulted in an open circuit voltage of about 100 mV to 450 mV as measured with a Fluke 189 voltmeter.

Although certain embodiments and examples have been discussed, it will be understood by those skilled in the art that the scope of the claims extend beyond the specifically disclosed embodiments to other alternative embodiments and/or uses and obvious modifications and equivalents thereof.

We claim:

1. A method for forming a layer in a photonic device comprising:
    depositing the layer comprising a dielectric transition metal compound phase embedded in a conductive or semiconducting transition metal compound phase on a substrate for the photonic device by a vapor deposition process,
    wherein the dielectric transition metal compound phase comprises $TiF_3$, and
    wherein the layer is part of the photonic device.

2. The method of claim 1, wherein the layer comprises about 0.1 to 10 at % silicon.

3. The method of claim 1, wherein the layer comprises about 5 to about 50 at % nitrogen.

4. The method of claim 1, wherein the layer has a resistivity of between about $5 \times 10^3$ µΩm and about $5 \times 10^6$ µΩcm.

5. The method of claim 1, wherein the layer has a thickness of less than 3 nm.

6. The method of claim 1, wherein the vapor deposition process comprises a plurality of super-cycles, each super-cycle comprising a dielectric transition metal compound sub-cycle and a reducing sub-cycle, wherein:
    the dielectric transition metal compound sub-cycle comprises contacting the substrate with a vapor phase of a dielectric transition metal compound; and
    the reducing sub-cycle comprises alternately and sequentially contacting the substrate with a reducing agent and a nitrogen reactant.

7. The method of claim 6, wherein the dielectric transition metal compound comprises Ti.

8. The method of claim 6, wherein the dielectric transition metal compound is a metal fluoride.

9. The method of claim 6, wherein the dielectric transition metal compound is $TiF_4$.

10. The method of claim 6, wherein the reducing agent comprises at least one of silane, disilane, trisilane, borane, diborane, and triborane.

11. The method of claim 6, wherein the reducing agent is $Si_3H_8$.

12. The method of claim 6, wherein the nitrogen reactant comprises at least one of ammonia, $N_2H_4$, nitrogen atoms, nitrogen containing plasma, and nitrogen radicals.

13. The method of claim 6, wherein the dielectric transition metal compound sub-cycle and the reducing sub-cycle are carried out at a ratio of about 0.1 to 1 in at least one of the plurality of super-cycles.

14. The method of claim 1, wherein the conductive or semiconducting transition metal compound phase comprises an elemental transition metal, an alloy of transition metals, a transition metal oxide, a transition metal nitride, a transition metal silicide, or a transition metal carbide.

15. The method of claim 1, wherein the conductive or semiconducting transition metal compound phase comprises TiN.

16. The method of claim 1, wherein the dielectric transition metal compound phase consists of particles with a diameter of about 0.1 nm to about 500 nm.

17. The method of claim 1, wherein the conductive or semiconducting transition metal compound phase surrounds discrete dielectric transition metal compound phase particles in the layer.

18. The method of claim 1, wherein the layer comprising a dielectric transition metal compound phase embedded in a conductive or semiconducting transition metal compound phase acts as a photon transparent layer in the photonic device.

19. The method of claim 1, wherein the layer comprising a dielectric transition metal compound phase embedded in a conductive or semiconducting transition metal compound phase acts as a charge collecting component or a waveguide component in the photonic device.

* * * * *

UNITED STATES PATENT AND TRADEMARK OFFICE
CERTIFICATE OF CORRECTION

PATENT NO. : 10,861,986 B2
APPLICATION NO. : 15/921257
DATED : December 8, 2020
INVENTOR(S) : Tom E. Blomberg Page 1 of 1

It is certified that error appears in the above-identified patent and that said Letters Patent is hereby corrected as shown below:

On the Title Page

In Column 2, item (56), Other Publications, Line 1, delete "WxN /TiN" and insert --WxN/TiN--.

On page 3, in Column 2, item (56), Other Publications, Line 14, delete "transconductant-" and insert --transconductance- --.

On page 4, in Column 1, item (56), Other Publications, Line 8, delete "Zeitscrift" and insert --Zeitschrift--.

On page 4, in Column 1, item (56), Other Publications, Line 60, delete "Al$_2$O$_3$growth" and insert --Al$_2$O$_3$ growth--.

In the Specification

In Column 3, Line 23, delete "am," and insert --µm,--.

In Column 10, Line 63, delete "TF$_3$" and insert --TiF$_3$--.

In Column 12, Line 15, delete "herein in its" and insert --herein.--.

In Column 19, Line 25, delete "µΩcm" and insert --µΩcm.--.

In Column 19, Line 26, delete "tµΩcm" and insert --µΩcm--.

In the Claims

In Column 37, Line 49, Claim 4, delete "µΩm" and insert --µΩcm--.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*